324-77 SR

4/16/85 XR 4,510,840

United States Patent [19]

Inami et al.

[11] Patent Number: 4,510,840

[45] Date of Patent: Apr. 16, 1985

[54] MUSICAL NOTE DISPLAY DEVICE

[75] Inventors: Mamoru Inami, Yokohama; Yoshiaki Tanaka, Fujisawa; Zenju Otsuki, Tokyo, all of Japan

[73] Assignee: Victor Company of Japan, Limited, Japan

[21] Appl. No.: 567,175

[22] Filed: Dec. 30, 1983

[30] Foreign Application Priority Data

| | | | |
|---|---|---|---|
| Dec. 30, 1982 | [JP] | Japan | 57-232457 |
| Jan. 13, 1983 | [JP] | Japan | 58-3670 |
| Jan. 20, 1983 | [JP] | Japan | 58-7696 |
| Jan. 26, 1983 | [JP] | Japan | 58-10994 |
| Jan. 31, 1983 | [JP] | Japan | 58-14364 |

[51] Int. Cl.³ ...................... G10G 1/00; G09B 15/02; G01R 23/16

[52] U.S. Cl. .............................. 84/477 R; 324/77 A; 324/77 B

[58] Field of Search ..................... 84/454, 462, 470 R, 84/478, 477 R, DIG. 6, DIG. 18; 381/49, 50; 324/77 R, 77 A, 78 R

[56] References Cited

U.S. PATENT DOCUMENTS

| | | | |
|---|---|---|---|
| 4,078,469 | 3/1978 | Calvin | 84/477 R X |
| 4,366,741 | 1/1983 | Titus | 84/478 |
| 4,377,961 | 3/1983 | Bode | 84/454 X |
| 4,399,732 | 8/1983 | Rothschild | 84/477 R X |
| 4,429,609 | 2/1984 | Warrender | 84/477 R X |
| 4,434,697 | 3/1984 | Roses | 84/477 R X |

FOREIGN PATENT DOCUMENTS

| | | | |
|---|---|---|---|
| 23421 | 2/1980 | Japan | 84/462 |
| 2064851 | 6/1981 | United Kingdom | 84/462 |

*Primary Examiner*—William B. Perkey
*Attorney, Agent, or Firm*—Lowe, King, Price & Becker

[57] ABSTRACT

An input audio signal is AD converted into digital data which is processed by a central processing unit (CPU) in which Fast Fourier Transform (FFT) operation and power spectrum calculation are effected. Furthermore, spectrum data obtained in this way is processed to obtain a fundamental tone to determine the pitch of each sound of the input audio signal. After the pitch is determined, data indicative of a given pattern is produced so that a musical note is indicated at an appropriate position on a staff displayed on a screen of a display unit. Such data from the CPU is fed via a video display processor to a video RAM to be stored therein where the video display processor produces a video signal fed to the display unit in turn. Since the fundamental tone does not necessarily have the highest level within the spectrum of the input audio signal, various ways for accurate determination of the pitch are used. Furthermore, a reference pitch preset in the musical note display device may be changed so as to be equal to a reference pitch emitted from a musical instrument or the like by changing sampling frequency of sampling pulses fed to an AD converter.

35 Claims, 28 Drawing Figures

FIG. 3

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 0 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| 1 | 32 | 33 | 34 | 35 | 36 | 37 | 38 | | | | | | | | | | | | | | | | | | 56 | 57 | 58 | 59 | 60 | 61 | 62 | 63 |
| 2 | 64 | 65 | 66 | 67 | 68 | 69 | | | | | | | | | | | | | | | | | | | | | 90 | 91 | 92 | 93 | 94 | 95 |
| 3 | 96 | 97 | 98 | 99 | 100 | | | | | | | | | | | | | | | | | | | | | | | | | 125 | 126 | 127 |
| 4 | 128 | 129 | 130 | 131 | | | | | | | | | | | | | | | | | | | | | | | | | | | 158 | 159 |
| 5 | 160 | 161 | 162 | | | | | | | | | | | | | | | | | | | | | | | | | | | | 190 | 191 |
| 6 | 192 | 193 | | | | | | | | | | | | 205 | | | | | | | | | | | | | | | | | 222 | 223 |
| 7 | 224 | 225 | | | | | | | | | | | | | | | | | | | | | | | | | | | | | 254 | 255 |
| 8 | 256 | 257 | | | | | | | | | | | | | | | | | 274 | | | | | | | | | | | | 286 | 287 |
| 9 | 288 | 289 | | | | | | | | | | | | | | | | | | | | | | | | | | | | | 318 | 319 |
| 10 | 320 | 321 | | | | | | | | | | | | | | | | | | | | | | | | | | | | | 350 | 351 |
| 11 | 352 | 353 | | | | | | | | | | | | | 366 | 367 | 368 | | | | | | | | | | | | | | 382 | 383 |
| 12 | 384 | 385 | | | | | | | | | | | | | | 399 | 400 | 401 | | | | | | | | | | | | | 414 | 415 |
| 13 | 416 | 417 | | | | | | | | | | | | | | | 432 | 433 | 434 | | | | | | | | | | | | 446 | 447 |
| 14 | 448 | 449 | | | | | | | | | | | | | | | | | | | | | | | | | | | | | 478 | 479 |
| 15 | 480 | 481 | | | | | | | | | | | | | | | | | | | | | | | | | | | | | 510 | 511 |
| 16 | 512 | 513 | | | | | | | | 521 | | | | | | | | | | | | | | | | | | | | | 542 | 543 |
| 17 | 544 | 545 | 546 | | | | | | | | | | | | | | | | | | | | | | | | | | | | 574 | 575 |
| 18 | 576 | 577 | 578 | 579 | | | | | | | | | | | | | | | | | | | 598 | | | | | | | | 606 | 607 |
| 19 | 608 | 609 | 610 | 611 | 612 | | | | | | | 619 | | | | | | | | | | | | | | | | | | | 638 | 639 |
| 20 | 640 | 641 | 642 | 643 | 674 | 675 | | | | | | | | | | | | | | | | | | | | | | | 698 | 699 | 670 | 671 |
| 21 | 672 | 673 | 674 | 675 | 676 | 677 | 678 | 679 | | | | | | | | | | | | | | | | | | | | 699 | 700 | 701 | 702 | 703 |
| 22 | 704 | 705 | 706 | 707 | 708 | 709 | 710 | 711 | 712 | | | | | | | | | | | | | | | | | 729 | 730 | 731 | 732 | 733 | 734 | 735 |
| 23 | 736 | 737 | 738 | 739 | 740 | 741 | 742 | 743 | 744 | 745 | 746 | 747 | 748 | 749 | 750 | 751 | 752 | 753 | 754 | 755 | 756 | 757 | 758 | 759 | 760 | 761 | 762 | 763 | 764 | 765 | 766 | 767 |

MUSICAL NOTE DISPLAY DEVICE

BACKGROUND OF THE INVENTION

This invention relates generally to audio signal processing, and more particularly the present invention relates to a display device which indicates musical notes representing varying pitch of an input audio signal on a screen of a display unit.

Musical note display devices, which are capable of indicating musical notes on a staff of a music sheet in accordance with input audio signals from a musical instrument, have been desired since such a device is useful for composing or writing music and for music education. Various devices have been made previously for indicating musical notes, and a conventional device of this sort is simply arranged to selectively energize lamps on a board on which a staff of a musical sheet is indicated, in accordance with electrical signals produced by a keyboard. However, such a conventional display device cannot handle sounds emitted from musical instruments which do not have a keyboard, such as stringed instruments or wind instruments. Therefore, in other conventional display devices, sounds from musical instruments are first converted into an electrical signal, and frequency analysis is effected by using a number of band pass filters so as to determine the pitch to be displayed by way of a lamp selected from a plurality of lamps on a staff-like board or a display panel. However, such a conventional musical note display device requires a number of band pass filters, and therefore it suffers from having a complex structure.

SUMMARY OF THE INVENTION

The present invention has been developed in order to remove the above-described drawbacks inherent to the conventional musical note display devices.

It is, therefore, an object of the present invention to provide a new and useful musical note display device, which is capable of accurately indicating musical notes on a staff of sheet-music displayed on a display unit screen without requiring a complex structure.

According to a feature of the present invention an input audio signal is AD converted to obtain digital data which are used in Fast Fourier Transform (FFT) operation, and the results of FFT operation are used for power spectrum calculation, and then spectrum data obtained in this way are used to determine a fundamental tone in a particular way so that the pitch of the input audio signal is accurately detected. After the pitch is obtained, pattern data indicative of a musical note is produced and transmitted via a video display processor to a video RAM, thereby producing a video signal for indicating a staff and musical notes at appropriate position in the displayed staff on a display unit screen.

In accordance with the present invention there is provided a musical note display device for displaying musical notes, each indicative of a pitch of an input audio signal on a displayed staff, comprising: analog-to-digital converting means for converting the input audio signal into digital data by using sampling pulses having a sampling frequency; computing means for effecting FFT operation by using the digital data, for executing power spectrum calculation by using the result of the FFT operation, for determining a pitch of each sound by using spectrum data obtained by the power spectrum calculation, and determining a pattern to be displayed in accordance with each pitch; the computing means determining the pitch by obtaining a fundamental tone from a frequency component whose level is lowest within a predetermined level range from a highest level, and whose frequency is lower than a frequency at which the level is the highest, and determining the pitch, in the case such a frequency component is not detected, by regarding the frequency component, whose level is the highest, as the fundamental tone; and display means including a video display processor, a video RAM and a display unit, the video display processor being controlled by the computing means to store data indicative of the pattern into the video RAM, and the display unit being responsive to a video signal from the video display processor for indicating musical notes displayed at appropriate position on a displayed staff.

BRIEF DESCRIPTION OF THE DRAWINGS

The object and features of the present invention will become more readily apparent from the following detailed description of the preferred embodiments taken in conjunction with the accompanying drawings in which:

FIG. 3 is an explanatory diagram of sections on a display unit screen of the musical note display device of FIG. 1A;

The same or corresponding elements and parts are designated by like reference numerals throughout the drawings.

DETAILED DESCRIPTION OF THE INVENTION

Figure 1A:
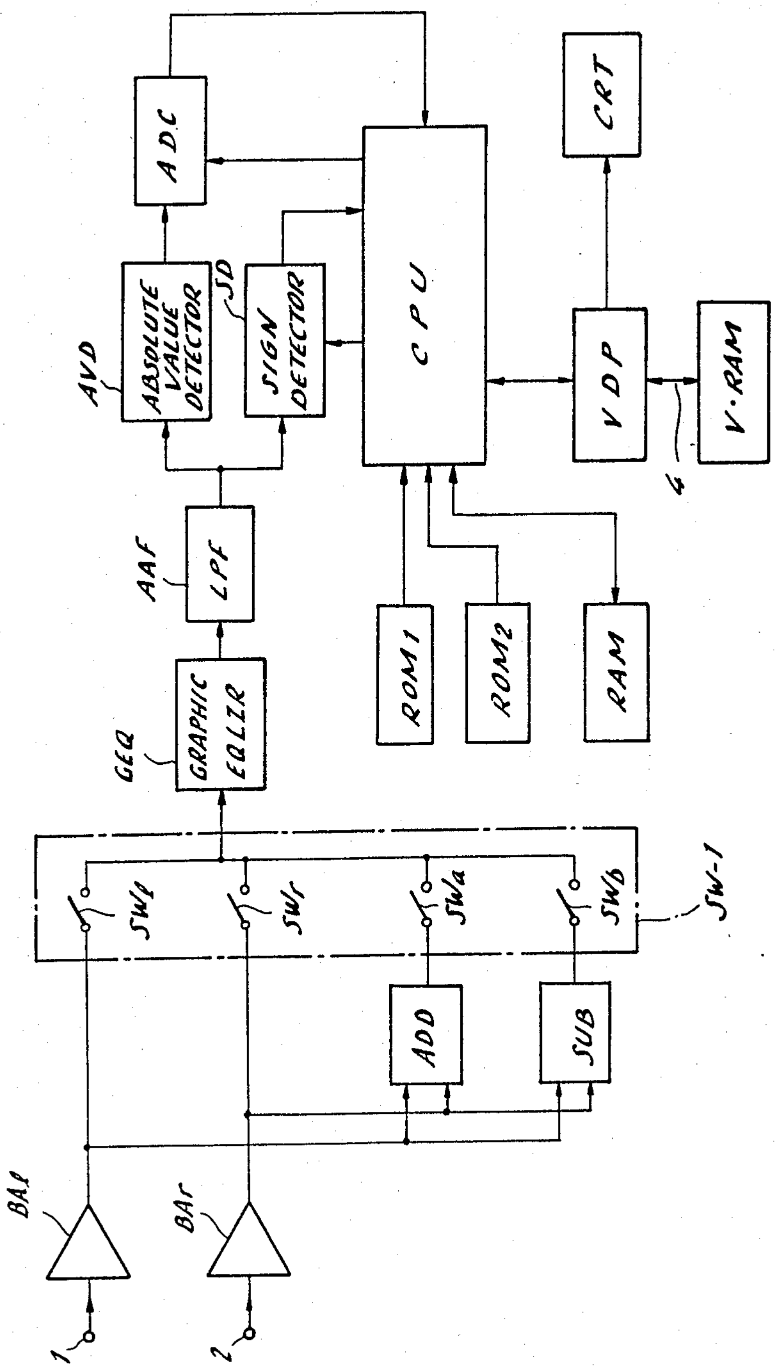
FIG. 1A is a schematic block diagram of a first embodiment of the musical note display device according to the present invention.

Referring to FIG. 1A, a block diagram of an embodiment of the musical note display device according to the present invention is shown. In FIG. 1A, the reference 1 is an input terminal of the left channel (channel L), and the reference 2 is an input terminal of the right channel (channel R). The channel L signal is applied to a switch $SW_l$, an adder ADD and a subtractor SUB after being amplified by a buffer amplifier BAl, while the channel R signal is applied to a switch SWr, the adder ADD and the subtractor SUB after being amplified by another buffer amplifier BAr.

The adder ADD produces a sum signal of the channel L signal and the channel R signal to apply the sum signal to a switch SWa, while the subtractor SUB produces a different signal between the channel L signal and the channel R signal to apply the difference signal to a switch SWb.

The reference SW-1 shown by dot-dash lines in FIG. 1A is a selection switch comprising the above-mentioned individual switches SWl, SWr, SWa and SWb, and the selection switch SW-1 is arranged such that when one of the individual switches thereof is in ON state, remaining switches are all in OFF state so that one of signals selected by the single switch, which is in ON state, is applied to a subsequent circuit.

In the illustrated example, one of four signals, i.e. the channel L signal, channel R signal, the sum signal of the channel L signal and the channel R signal, and the difference signal between the channel L signal and the channel R signal, is selected by the selection switch SW-1.

A signal selected by the selection switch SW-1 is fed to a graphic equalizer GEQ, and an output signal from the graphic equalizer GEQ is fed via a low pass filter AAF, which functions as an anti-aliasing filter, to an absolute value detecting circuit AVD and to a sign detector SD. An output signal from the absolute value detector AVD is fed to an analog-to-digital converter ADC to be converted into a digital signal, which is fed to a centeral processing unit CPU. On the other hand, an output signal from the sign detector SD is directly applied to the central processing unit CPU where the sign detector SD is controlled by an output signal from the central processing unit CPU.

As the absolute value detector AVD, there may be used a full-wave rectifying circuit, while a circuit arrangement including a comparator arranged to output high and low level outputs depending on positive and negative input signals and a latch for temporarily storing output from the comparator, may be used as the sign detector SD.

Figure 1B:
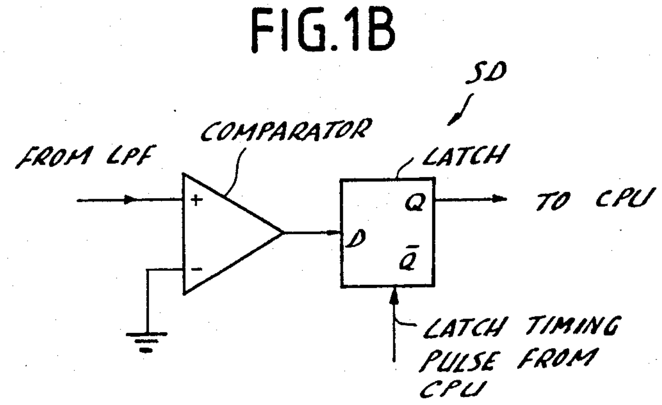
FIG. 1B is a diagram showing a sign detector used in the embodiment of FIG. 1A.

FIG. 1B shows an example of the sign detector SD having a comparator and a latch whose latching timing is determined by a leading (positive-going) edge of a latch-timing pulse fed from the central processing unit CPU. The sign detector SD thus outputs a signal of one bit indicating that the analog signal is either positive or negative, and this one bit signal from the sign detector SD is stored in a main memory RAM together with AD converted digital data as data to be used in Fast Fourier Transform (FFT) operation executed by the central processing unit CPU.

The output signal from the anti-aliasing filter AAF, is fed via the absolute value detector AVD to the AD converter ADC which receives sampling pulses having a sampling frequency fs. The above-mentioned absolute value detector AVD and the sign detector SD are employed to increase the resolution in AD conversion by one bit. Namely, the digital signal from the AD converter ADC and the one-bit signal from the sign detector SD are stored in the main memory RAM under the control of the central processing unit CPU so as to be used in Fast Fourier Transform (FFT) operation as will be described hereinafter, and the provision of the absolute value detector AVD and the signal detector SD enables AD conversion throughout a wider dynamic range with an AD converter of less bits.

The above-mentioned graphic equalizer GEQ is employed to alter the frequency response in accordance with the sort of musical instruments whose audio signal is an objective of analysis, so that frequency analysis will be satisfactorily effected in connection with respective musical instruments. The anti-aliasing filter AAF limits the frequency range of the input audio signal so as to prevent aliasing noises, which are apt to occur during AD conversion.

The above-mentioned buffer amplifiers BAl and BAr may comprise automatic gain control circuits respectively so that the level of the input audio signal is limited below a predetermined level which can be satisfactorily handled by the AD converter ADC.

Assuming that the cutoff frequency of the anti-aliasing filter AAF is set to fc, the sampling frequency fs within the AD converter ADC should be set to a value equal to or higher than 2fc in accordance with well known sampling theorem. The digital signals obtained by AD conversion are processed by the central processing unit CPU to perform frequency analysis by way of FFT operation. In the above, FFT operation is an algorithm for the machine calculation of complex Fourier Series established by Cooley and Tukey and described in MATHEMATICS OF COMPUTATION, page 297, published April 1965. Namely, FFT operation is effected to obtain a spectrum of the input audio signal, and a frequency interval f within the spectrum obtained as the result of frequency analysis, as is well known, is expressed by:

$$f=fs/N$$

wherein N is the number of digital data used in FFT operation.

For instance, when the cutoff frequency fc of the anti-aliasing filter AAF is 20 KHz, and when it is intended to obtain a spectrum with a frequency interval of 10 Hz as the result of frequency analysis by FFT operation with a sampling frequency fs of 40 KHz (fs=2fc), the number N of digital data to be used in the FFT operation is 4,000.

Since the FFT operation requires a longer time as the number N of data used therefor increases, a large number of data causes time required for determining the pitch of the input signal to be long. Therefore, when it is difficult to display musical notes at real time due to such time lag, it is preferable to use a signal processor such as TI's TMS320 for executing operations similar to FFT operation so that musical notes will be displayed at substantially real time.

According to the present invention input audio signals are frequency analyzed by way of FFT operation to determine the pitch of each sound of the input audio signal, and then the pitch is indicated on a display unit screen by way of a musical note or a particular symbol or mark on a displayed keyboard. Therefore, it is necessary to determine the pitch of the input audio signal first for accurately indicating such a note or symbol at a right poisition on a displayed staff of a music sheet or displayed keyboard.

In order to determine the pitch of a sound, a scale or refererence for the determination is required, and for instance, a twelve-tone temperament system may be adopted. In the case that the pitch of an input audio signal is indicated on a staff displayed on a display unit screen, the position of a music note on the staff or the position of a symbol on a keyboard has to be accurately determined as the result of frequency analysis by determining which position among various positions within F2 through F5 of a staff corresponds to the frequency of the input sound. For instance when a fundamental tone of an input audio signal is determined to have a frequency of 440 Hz, the pitch thereof is determined as it corresponds to pitch name A4. Similarly, when the fundamental tone is detected to have a frequency of 146.83 Hz, the pitch is determined as it corresponds to pitch name D3.

Figure 5A:
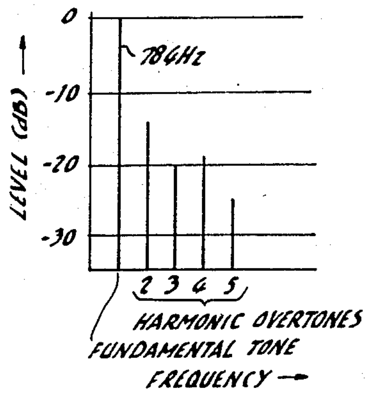
FIGS. 5A through 5D are spectrum diagrams showing fundamental tone and harmonic overtones of sounds from various musical instruments.
Figure 5B:
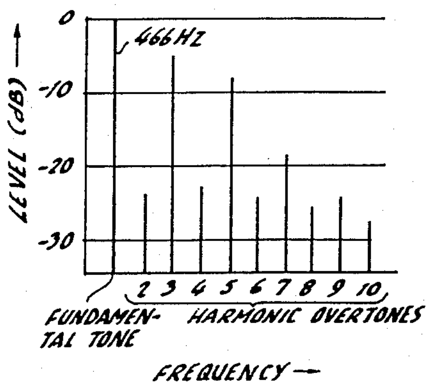
Figure 5C:
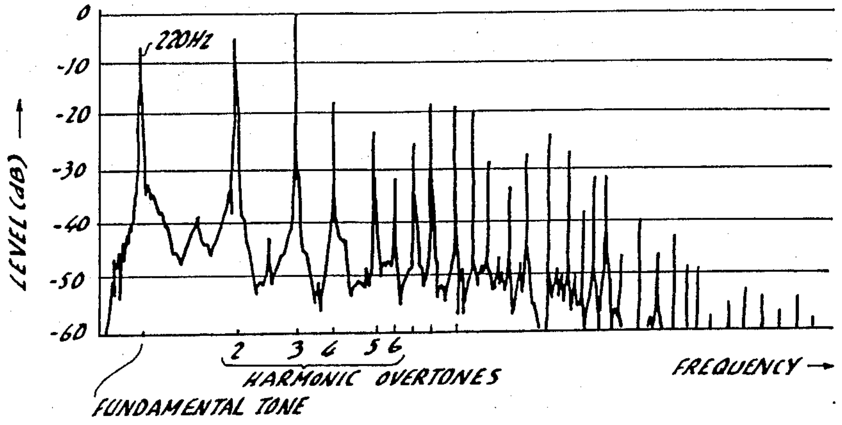
Figure 5D:
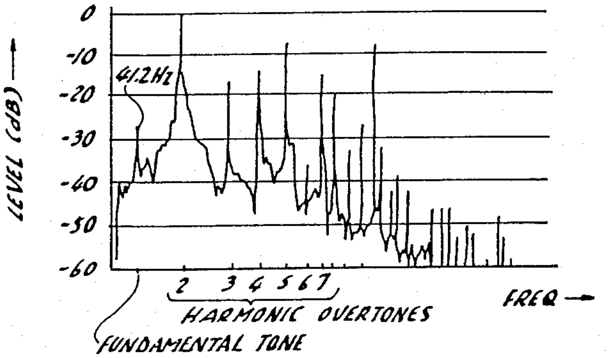

However, the pitch of an input audio signal cannot be simply determined for the following reasons. Namely, although in some musical instruments the amplitude of a fundamental tone resulting from frequency analysis is the greatest among other tones within the spectrum thereof, in some other musical instruments the amplitude of a fundamental tone is not always greater than harmonic overtone(s). FIGS. 5A through 5D respectively show the results of frequency analysis in connection with various sounds emitted from various musical instruments. Namely, FIG. 5A shows a spectrum for the flute; FIG. 5B for the clarinet, FIG. 5C for the violin (string tuned g); FIG. 5D for the contrabass (string tuned e). In the spectrums of FIGS. 5A and 5B for the flute and the clarinet, and also for other wind instruments, the amplitude or level of the fundamental tone is the highest, namely higher than any harmonic overtones. Such a tendency is seen in connection with the guitar and piano. However, in the case of the violin and the contrabass, one or more harmonic overtones have higher amplitude than that of the fundamental tone as shown in FIGS. 5C and 5D.

For the above reason, the pitch of sound emitted from a musical instrument cannot be simply determined by using the result of frequency analysis. In other words, the frequency at which the level is greatest, cannot be simply adopted as the pitch of the sound since the frequency may be a harmonic overtone. Therefore, it is necessary to analyze the relationship between levels at various frequencies obtained as the result of frequency or spectrum analysis to finally determine the fundamental tone of the input sound for indicating the pitch accurately on a staff or keyboard displayed on a display unit screen.

According to the present invention the digital data obtained by AD conversion are processed to perform FFT operation and power spectrum calculation first, and then after levels of various frequency components within the spectrum of an input audio signal are obtained, a frequency component whose level is lowest within a predetermined level range from the highest level is detected from a frequency range which is lower than the frequency at which the level is the highest. The frequency component obtained in this way is thus determined as the fundamental tone, and the pitch of the sound is determined accordingly. In case such a frequency component is not detected, the frequency at which the level is the highest is determined as the fundamental tone.

By using the above-mentioned way of detection, the fundamental tone can be accurately detected even if the level at the fundamental tone is lower than that of one or more harmonic overtones.

The above point will be further described with reference to FIGS. 5A through 5D. When the level at the fundamental tone is the highest within the spectrum of an input audio signal as in FIGS. 5A and 5B, the frequency at which the level is the highest should be detected as the fundamental tone. Since the frequency of the fundamental tone is the lowest within the spectrums of FIGS. 5A and 5B, no frequency component is detected within a frequency range below a frequency at which the level is the highest. Therefore, the highest-level frequency is detected as the fundamental tone.

On the other hand, in the case of FIG. 5C the level at the third harmonic overtone is the highest. Therefore, a frequency component having a level which is smallest within a predetermined level range from the highest level has to be detected to obtain the fundamental tone. The predetermined level range is set to 10 dB or so. In the illustrated example of FIG. 5C, although the level at the fundamental tone is smaller than that of the second harmonic overtone, the fundamental tone is accurately detected with distinguishment from the second harmonic overtone by detecting a frequency component having the lowest level with the predetermined level range (10 dB) from the highest level and a frequency lower than the highest-level frequency. Similarly, in the case of FIG. 5D, the level at the second harmonic overtone is the highest. However, no frequency component exists within the predetermined level range (10 dB) from the highest level within a frequency range below the second harmonic overtone. Therefore, the above-mentioned manner of detection has a chance to fail to detect the fundamental tone in the case of FIG. 5D. In order to accurately detect the fundamental tone from the spectrum of FIG. 5D, therefore, if no frequency component is detected within a predetermined level range (10 db) from the highest level within a frequency range below the highest-level frequency, another detection is effected by using a second predetermined level range which is greater than the above-mentioned predetermined level range. For instance, a frequency component having a level which is within 30 dB from the highest level is detected from a frequency range below the highest-level frequency.

In this way the fundamental tone, and therefore the pitch, of sound emitted from the contrabass string tuned e is accurately detected. However, in most of musical instruments, the level difference between the fundamental tone and its harmonic overtones is within 10 dB, and therefore, the contrabass string tund e is an exception.

Since the spectrum obtained from the sound of contrabass string tuned e is an exception, the above-mentioned way of detection using the second predetermined level range, such as 30 dB, is effected in connection with signals having low frequencies. To this end it is determined whether the frequency at which the level is the highest is below a predetermined low frequency, for instance 100 Hz. In the case that the highest-level frequency is below 100 Hz the frequency component within the second predetermined level range is searched within a frequency range below 100 Hz. On the other hand, in the case that the highest-level frequency is above 100 Hz, the fundamental tone thereof can be detected by detecting a frequency component whose level in the lowest within the first predetermined frequency range of 10 dB as described in the above. If no frequency component is detected in both the first and second predetermined level ranges, the highest-level frequency is then determined as the fundamental tone.

Although a true frequency value of the fundamental tone can be detected accurately with the above-described method, the frequency relationship between a frequency component considered as the fundamental tone and the highest-level frequency may also be checked to further increase the accuracy. Since the fundamental tone to be detected always has an octave relationship with the harmonic overtones, whose level may be the highest among the spectrum, the presence of such an octave relationship may be detected. In detail, when a frequency component is detected within the above-mentioned first or second predetermined level range, it is checked whether the frequency value of the detected frequency component is one half or one third of the highest-level frequency value. By this manner of detection, possible erroneous detection due to noises can be effectively avoided.

The cutoff frequency of the above-mentioned anti-aliasing filter AAF is determined as follows. Namely, when it is intended to indicate the pitch of an input audio signal in connection with sound of a pitch name F5, the anti-aliasing filter AAF is required to pass frequencies of harmonic overtones of the fundamental tone of pitch name F5. Since it is necessary to pass frequencies as high as the third harmonic overtone for effecting accurate frequency analysis, the cutoff frequency fc of the anti-aliasing filter AAF has to be set to a value which is higher than three times the frequency (698.46 Hz) of pitch name F5. In practice, it is desirable that the cutoff frequency fc of the anti-aliasing filter AAF is set to a value which is as high as possible unless it is limited by other conditions.

Figure 4:
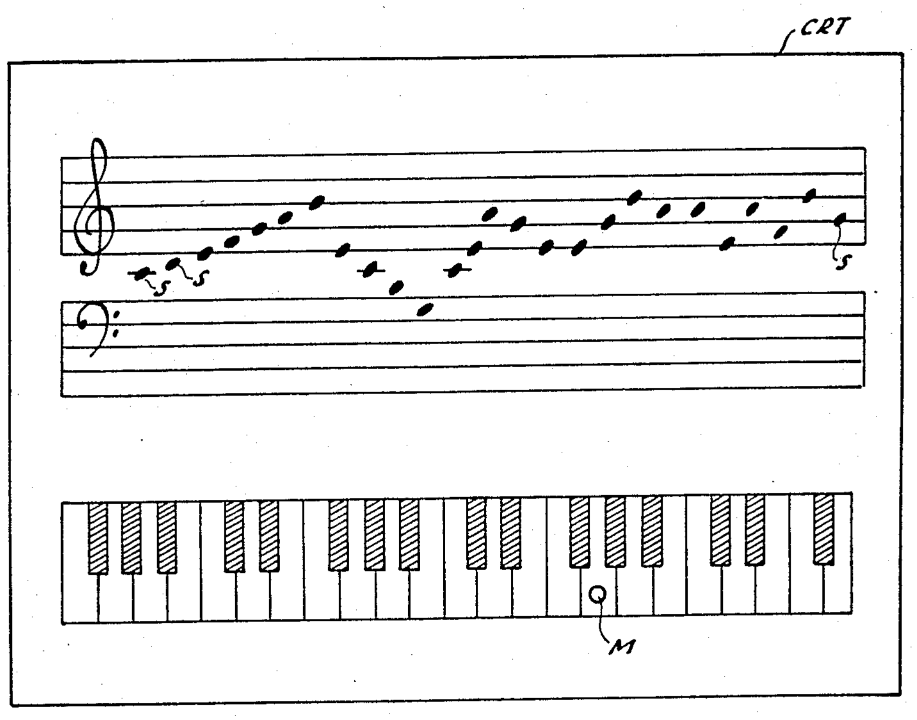
FIG. 4 is a diagram showing an example of a display pattern on the display unit screen.

Turning back to FIG. 1A, the central processing unit CPU performs predetermined control operations and calculations in accordance with a program stored in a read-only memory ROM1, and also sends data via a video display processor VDP to a video RAM V.RAM. The reference ROM2 is a high-speed memory in which a program for spectrum analysis is prestored. Furthermore, CRT is a display unit, where the display unit CRT is of the type using a cathode ray tube in the following description. On a screen of the display unit CRT is indicated the result of pitch analysis as shown in FIG. 4 for instance.

The video display processor VDP functions as an interface between the video RAM V.RAM connected thereto via a data bus 4, and the central processing unit CPU, and is constructed such that it is capable of determining the contents of pictures by using various data stored in the above-mentioned video RAM V.RAM, and of generating a composite video signal of a predetermined standard system. As this video display processor VDP, for instance, there may be used a video display processor of Texas Instruments, Inc., of the United States, introduced in ELECTRONICS, Nov. 20, 1980 (pages 123–126) or an integral composite video generator disclosed in U.S. Pat. No. 4,262,302 issued to Texas Instruments and kniown as TI's TMS9918, and it is to be assumed that the above-mentioned video display processor is used in the following description.

In FIG. 1A, although no address-decoder is shown, in actual structure an address-decoder responsive to address data from the central processing unit CPU is provided so as to respectively designate the addresses of the main memory RAM, read-only memories ROM1 and ROM2, AD converter ADC, and the video display processor VDP. The central processing unit CPU is preferably of high-speed and capable of commanding signed multiplication, which is a basic calculation for FFT. As the central processing unit CPU may be used an integrated circuit TMS9995 manufactured by Texas Instruments.

Figure 2:
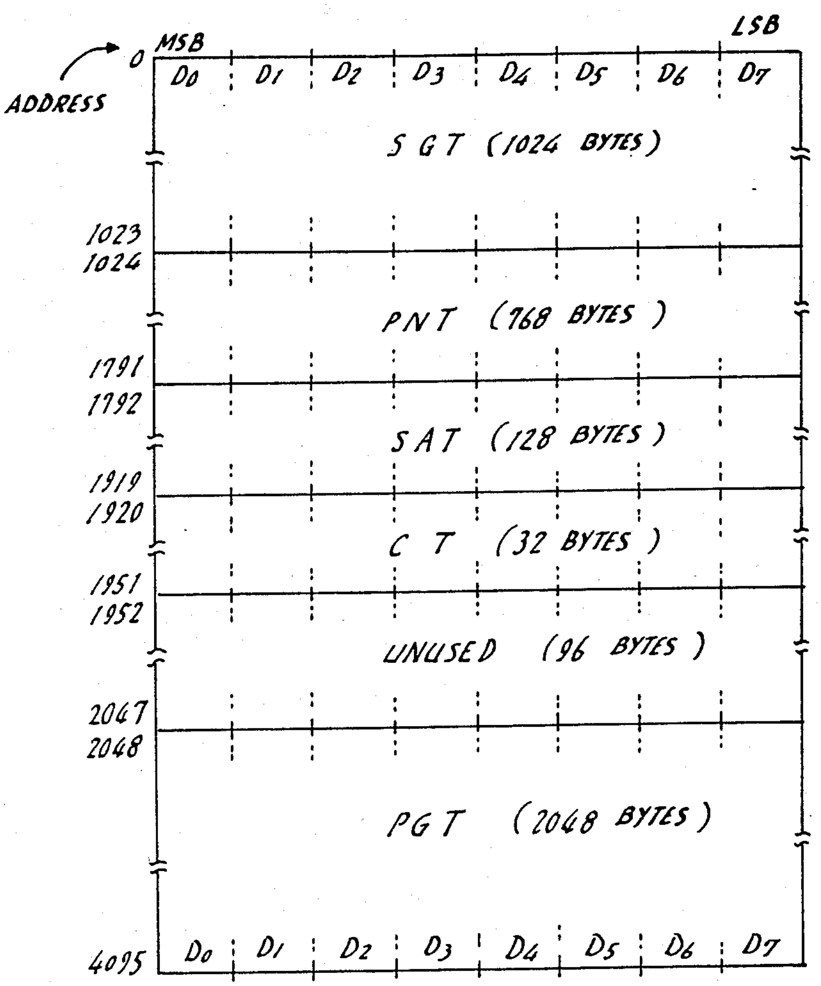
FIG. 2 is an example of a memory map of a video RAM used in the embodiment of FIG. 1A.

FIG. 2 is a drawing showing an example of a memory map of the video RAM V.RAM connected via the bus 4 to the video display processor VDP. In the memory map of the video RAM of FIG. 2, 1024 bytes from address 0 to address 1023 are used as a sprite generator table (SPG); 768 bytes from address 1024 to address 1791 being used as a pattern name table (PNT); 128 bytes from address 1792 to address 1919 being used as a sprite attribute table (SAT); 32 bytes from address 1920 to address 1951 being used as a color table (CT); and 96 bytes from address 1952 to address 2047 being unused yet; and 2048 bytes from address 2048 to address 4095 being used as a pattern generator table (PGT).

The pattern generator table PGT is capable of storing a specific pattern of 8 pixels by 8 pixels by using 8 bytes respectively for instance, and therefore 256 patterns of 8 by 8 pixels can be stored. The pattern information stored in the pattern generator table PGT is transmitted from the read-only memory ROM1 at an initial state of the device by the operation of the central processing unit CPU. However, the pattern generator table PGT may of course be a read-only memory.

In the storing region including 8-byte portions of the pattern generator table PGT are stored specific patterns of 8 by 8 pixels are respectively stored, and respective specific patterns can be designated by pattern names assigned to respective storing regions in which the specific patterns are respectively stored. In the case of the pattern generator table PGT of FIG. 2, 256 patterns can be designated by way of 256 pattern names from pattern name #0 through pattern name 255.

Next, the pattern name table PNT comprises a storing capacity corresponding to a total number of displaying sections imagined on the screen of the display unit CRT so as to store information indicating which section is of which pattern name of the pattern generator table PGT.

In an example of FIG. 3, the total number of sections set in the display unit screen is [32 columns×24 rows]=768, and since 1 byte is used as the amount of information for indicating 1 section, the pattern name table PNT has a storing capacity of 768 bytes as mentioned in the above.

In the case that a necessary number of patterns are stored in the pattern generator table PGT of the video RAM V.RAM, and that necessary pattern names assigned in correspondence with respective patterns are stored in the respective sections of the display unit screen of the pattern name table PNT, the video display processor VDP produces a composite video signal complying with a specific standard system where the contents of the picture is determined by information stored in the pattern name table PNT of the video RAM V.RAM, information stored in the pattern generator table PGT, and information stored in the color table CT when necessary, and the produced composite video signal being fed to the display CRT for displaying a specific pattern on the screen of the display unit CRT.

The above description is related to a case of displaying under a display mode in which a specific one of patterns stored in the pattern generator table PGT is displayed at a specific section among 768 sections, namely, so called graphic mode. When displaying a pattern with such a graphic mode, the position of the pattern is designated by the pattern name table PNT, and therefore, when it is intended to move a pattern on the display unit screen, the pitch of pattern movement on the display unit screen is 1 section (distance of 8 pixels).

In order to cause the pattern to move smoothly with the pitch of pattern movement on the display unit screen being made small, the pattern stored in the sprite generator table SGT is moved on the display unit screen at a pitch of 1 pixel with a change in co-ordinates.

The pattern to be stored in the sprite generator table SGT is sprite data which may be of either 8 pixels by 8 pixels or 16 pixels by 16 pixels. Respective patterns stored in the sprite generator table SGT are given sprite names separately as #0, #1 . . . #N, a sprite surface corresponding to a pattern with respective sprite names are arranged so that smaller numerical values indicated by the sprite names have higher priority.

In the memory map of the video RAM V.RAM shown in FIG. 2, since 1024 bytes from address 0 to address 1023 are used as the sprite generator table SGT as described in the above, 128 patterns (sprite name #0 through #127) can be stored in the case of 8 pixels by 8 pixels in this case, and also 32 patterns (sprite name #0 through #31) can be stored in the case of 16 pixels by 16 pixels. In the case that 2048 bytes are assigned to the sprite generator table SGT of the video RAM V.RAM, it is a matter of course that the number of patterns which can be stored in the sprite generator table SGT is twice as much as the above example.

Since sprite position (1 byte for designating each of vertical position and horizontal position), name of display sprite (1 byte). color code and display sprite termination code (1 byte) and the like are set in the sprite attribute table SAT by using 4 bytes for each one sprite, in the case that 128 bytes are used as the sprite attribute table SAT, information of 32 sprites is stored in the sprite attribute table SAT.

The position of a sprite is determined with a vertical position (a numerical value indicating the vertical order of picture point) and a horizontal position (a numerical value indicating the horizontal order of pictue point) being written in the sprite attribute table SAT, where a co-ordinate of 49,152 picture points determined by 256 picture points (8 pixels by 32 sections) of horizontal direction (X direction) and 192 picture points (8 pixels by 24 sections) of vertical direction (Y direction) is provided wherein an origin of the sprite is set to the left top end, and the movement of the sprite is effected with a pitch of 1 pixel.

In the musical note display device for audio signals according to the present invention, musical notes of an audio signal are displayed on a screen of a display unit CRT by way of a staff and a displayed keyboard, for instance as shown in FIG. 4 by an arrangement such that the selection of a pattern to be displayed on the screen of the display unit and the designation of the way of movement of the pattern are effected by data written in the pattern name table PNT and the sprite attribute table SAT with a plurality of patterns being prestored in the pattern generator table PGT and the sprite generator table SGT.

In FIG. 4, showing an example of a displaying state on the screen of the display unit CRT, various display patterns, such as staffs, treble clef, bass clef, and a diagram of a keyboard, are all prepared with the data being prestored in the read-only memory ROM1. At the beginning of the operation of the musical note display device of FIG. 1A, the above-mentioned various patterns stored in the read-only memory ROM1 are transferred to and stored in the pattern generator table PGT of the video RAM V.RAM via the central processing unit CPU and the video display processor VDP, so as to be used for indication at the screen of the display unit CRT. Namely, at the beginning of the operation of the display device, only the staff with a clef and the keyboard are displayed, and then musical notes S and a symbol M are respectively displayed on the staff and the keyboard in response to input sound. In detail, musical notes S are displayed in sequence following the pitch change of the input audio signal, while the symbol M, indicating a position on the keyboard, moves to a right position coresponding to the pitch each time a different pitch sound is detected. This point will be described in detail hereinlater.

Figure 6A:
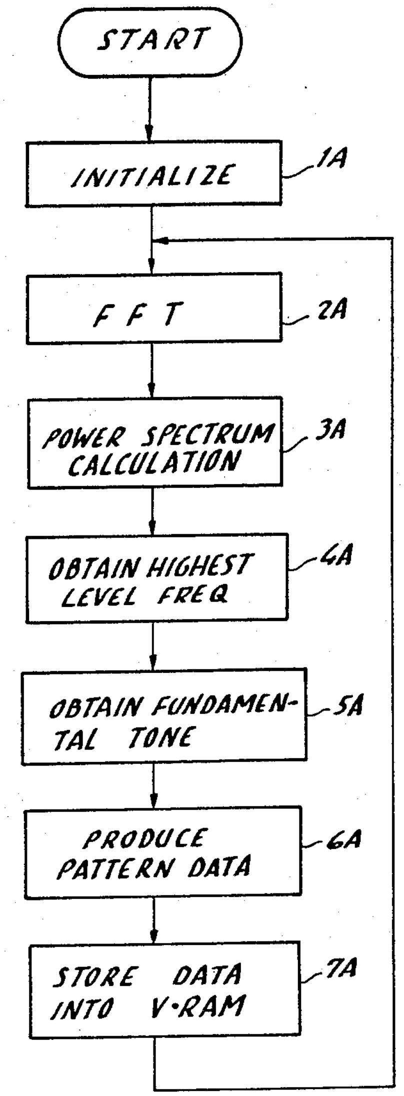
FIGS. 6A and 6B are flow charts showing the operation of the central processing unit used in the embodiment of FIG. 1A.
Figure 6B:
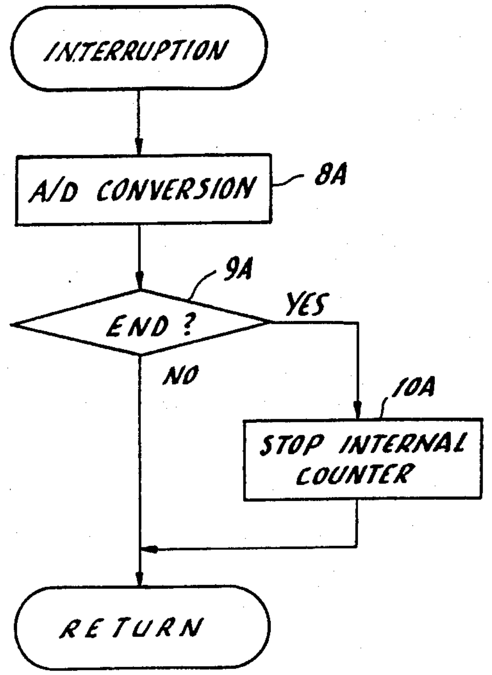

The central processing unit CPU produces data necessary for displaying the pitch of an audio signal by executing steps in flow charts of FIGS. 6A and 6B, and the data is fed to the video display processor VDP and to the video RAM V.RAM to cause the display unit CRT to display the musical notes and symbol on the keyboard as shown in FIG. 4.

In the flow charts of FIGS. 6A and 6B, at the START power is applied to start the display device, and subsequently in a STEP 1A initialization (system initialization) is effected to clear the AD converter ADC, the main memory RAM, the video ram V.RAM and the like, while the registers of the video display processor VDP are set, and using region setting, in which it is determined which storing region of the video ram V.RAM is used for which table, as well as operating mode setting is performed, and a predetermined sort of pattern information (for example, the pattern information of various diagrams of FIG. 4) is transmitted from the read-only memory ROM1 via the video display processor VDP to the pattern generator table PGT, and predetermined pattern information is transmitted from the read-only memory ROM1 to the sprite generator table SGT, and furthermore, sprite names, X-ordinate, color data and the like are transmitted from the read-only memory ROM1 to the sprite attribute table SAT.

The central processing unit CPU repeatedly executes respective STEPs from STEP 2A to STEP 7A of a main routine of FIG. 6A, and is arranged to execute STEPs from STEP 8A to STEP 10A of an interrupt service routine of FIG. 6B at an interval corresponding to a sampling period which is determined by a preset value set in an internal counter of the central processing unit CPU. Namely, when an interruption occurs, the execution of the STEPS 2A to 7A of the main routine is interrupted to execute the STEPs 8A to 10A of the interrupt service routine of FIG. 6B so that control of AD conversion in the AD converter ADC is effected. In other words, the central processing unit CPU executes the STEPs 2A to 7A of the main routine within time other than time used for the control of AD converter ADC.

When the preset value of the internal counter is reached, interruption occurs at an interval corresponding to the sampling period of the AD converter ADC, the central processing unit CPU sends an AD conversion-start pulse to the AD converter ADC in the STEP 8A, and then the AD converter ADC AD converts the input audio signal into digital signals which are stored in turn in the main memory RAM.

In the following STEP 9A, it is determined wether the number of AD converting times has reached a predetermined number, i.e. whether a predetermined number of digital data have been obtained. If the determination in the STEP 9A is NO, the operational flow goes to RETURN to return to the main routine. On the other hand if YES, the STEP 10A takes place to stop the internal counter with the count thereof being reset to zero, and then the operational flow goes to RETURN.

Assuming that the above-mentioned predetermined number of the digital signals or data from the AD converter ADC is expressed by n, after n digital data are stored into the main memory RAM, these n digital data are then used in FFT operation executed in the STEP 2A to obtain n/2 spectrum data which are then stored in the main memory RAM.

FFT operation may be executed within a short period of time by the central processing unit CPU in accordance with a program stored in the read-only memory ROM2 which is of high-speed, or by the above-mentioned signal processor also within a short period of time. It may be determined which one of the above two ways is to be used in accordance with the necessity of real time display.

In the STEP 3A, power spectrum calculation is effected by using spectrum data obtained in the STEP 2A, and then the result thereof is stored in the main memory RAM. Subsequently in the STEP 4A, the greatest spectrum value is obtained, and in the STEP 5A a frequency value at which spectrum value is the smallest within a predetermined level range from the greatest or highest spectrum value within a frequency range below the frequency at which the spectrum value is the greatest, is obtained. The frequency value determined in this way is then determined as the fundamental tone of the input audio signal. In the case that no such a frequency value is detected, the frequency value at which the spectrum value is the greatest is determined as the fundamental tone. In this way, the pitch of the input sound is determined. In detail, when the fundamental tone indicative of the pitch of the sound is obtained, the frequency value therefor is converted into a corresponding pitch name by using a table stored in the main memory RAM where the table includes correspondence between frequency values and corresponding pitch names.

In the STEP 6A, data to be written into the pattern name table PNT, and the sprite attribute table SAT is produced in correspondence with the determined pitch name. Then in the STEP 7, data is transmitted from the main memory RAM via the video display processor VDP to the video RAM V.RAM, where the video display processor VDP produces a composite video signal by using data written in the video RAM V.RAM. The composite video signal is then fed to the display unit CRT to display the pitches of the varying input audio signal by way of musical notes S indicated at diplayed staf on a screen of the display unit CRT as shown in FIG. 4. Furthermore, the varying pitch may be indicated by a predetermined symbol M indicated at an appropriate key of a displayed keyboard as shown in FIG. 4.

In FIG. 4, the notes S are indicated in sequence as the pitch of the input sound changes along time base in such a manner that each note S is located at a corresponding position, that is, on one of the horizontal lines or at spaces therebetween. On the other hand, the symbol M is indicated such that one symbol M indicating a newest pitch is shown at one time on a corresponding key of the displayed keyboard.

A time interval between instants of appearance of two consecutive notes corresponds to the repetition period of the STEPs 2A to 7A of the main routine of FIG. 6A. Therefore, when it is arranged that 26 notes are displayed transversally on the displayed staff in sequence, if the repetition frequency of the STEPs 2A to 7A is 200 milliseconds for instance, the displayed staff is filled with 26 notes in correspondence with an input audio signal having a time length of 5.6 seconds.

After 26 notes are indicated on the display unit screen, namely on the staff in a direction from the left to the right as time goes, subsequent notes may be shown by clearing the previously displayed notes. In other words, when 26 notes are indicated, all the notes instantaneously disappear to show a cleared and empty staff so that the following notes are indicated in the same manner as in the above in sequence. However, if desired, in place of such a manner of cancellation the manner of display may be arranged such that the newest note appears at the right after the staff is filled with 26 notes, while the oldest note at the left disappears one by one as each new note comes up. Namely, displayed notes move leftward as each new note appears at the right. This manner of display is referred to as scroll. Operations necessary for such clearance of notes or for effecting scroll will be described hereinafter.

As described in the above, the cutoff frequency fc of the anti-aliasing filter AFF has to be set to a value much higher than the frequency corresponding to the highest pitch to be displayed for accurate frequency analysis. Therefore, when it is intended to display notes throughout 3 octaves ranging from pitch name F2 to F5, the cutoff frequency fc has to be much higher than 698.46 Hz which is the frequency of the fundamantal tone for the pitch name F5. For this reason it is preferable that the cutoff frequency fc is set to a value such as 20 KHz in view of accurate determination of the fundamental tone.

However, such a high cutoff frequency fc of the anti-aliasing filter AAF causes the sampling frequency fs for the AD converter ADC to be set to a high value since fs=2fc. Although such a high sampling frequency fs is desirable for accurate detection of the frequency of the input sound since accuracy in frequency analysis depends on the frequency interval f within the spectrum resulting from AD conversion, the increase in the sampling frequency fs results in an increase in the number of digital data resulting from AD conversion. Such increase in digital data number results in longer time in FFT operation, while some of the data are wasted without being used in FFT operation. Considering the above circumferences, it is possible to set the cutoff frequency fc of the anti-aliasing filter AAF to a value greater than three times the highest frequency of the frequency range of an objective sound. Namely, when pitch name F5 is the highest tone to be displayed, fc equals approximately 2.1 KHz.

As described in the above, when a low pass filter whose pass band has been narrowed to a necessary minimun value is used as the anti-aliasing filter AAF, the sampling frequency on AD conversion lowers. For instance, only 4.2 KHz is required as the sampling frequency in the above-mentioned case, and when it is intended to obtain a spectrum with a frequency interval of 10 Hz, the number of digital data necessary for FFT operation therefor is only 420. In this way, the above-described problem can be resolved.

However, in the case where an input audio signal includes high frequency components, such band limitation by way of the anti-aliasing filter AAF may cause the following signal processing circuits to suffer from erroneous determination in sound pitch. This point will be described with reference to FIG. 7.

Figure 7:
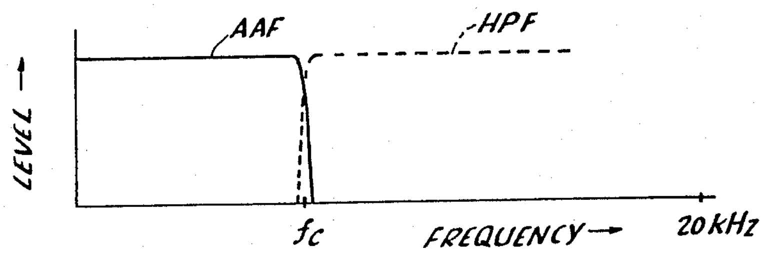
FIG. 7 is an explanatory diagram useful for understanding the operation of another embodiment of FIG. 8.

In FIG. 7, a solid line AAF indicates the pass band characteristic of the anti-aliasing filter AAF, while the cutoff frequency fc is a relatively low value, such as 2.1 KHz, within a frequency range, such as between 15 Hz and 16 KHz, of an audio signal.

Although no problem occurs if all the frequency components are included within a frequency range below the cutoff frequency fc of the anti-aliasing filter AAF, the result of sound pitch determination may be erroneous if frequency components having large amplitude exist around the cutoff frequency fc. This is because such frequency components around the cutoff frequency fc are reduced along the lowering curve or slope around the cutoff frequency, and therefore, the AD converter ADC following the anti-aliasing filter AAF cannot receive analog values accurately representing the original input audio signal so that frequency analysis effected by using digital data from such an AD converter ADC has a chance to be erroneous.

Figure 8:
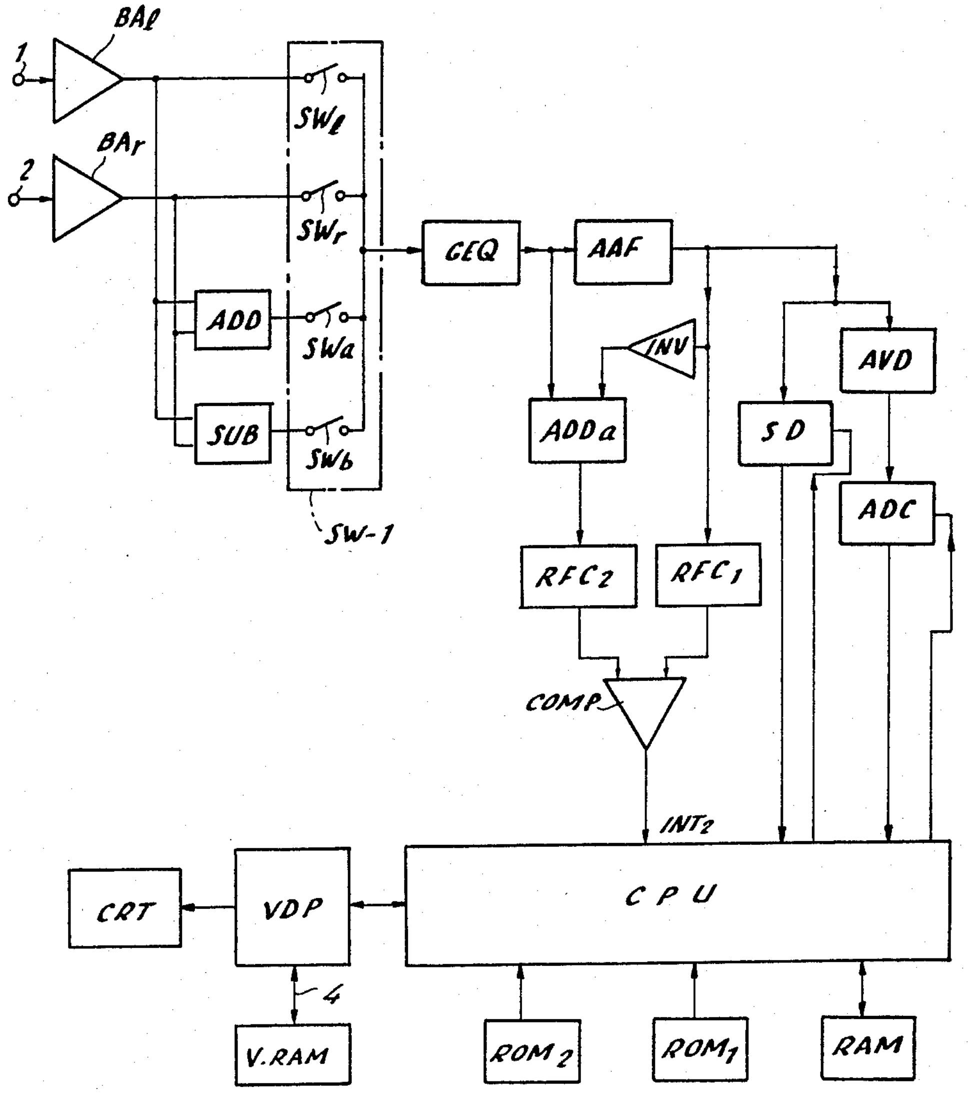
FIG. 8 is a schematic block diagram of a second embodiment of the musical note display device according to the present invention.

Hence, reference is now made to FIG. 8 which shows another embodiment of the musical note display device, which is arranged so as not to suffer from the above-mentioned problem even if the anti-aliasing filter AAF has a low cutoff frequency fc.

The embodiment of FIG. 8 differs from that of FIG. 1A in that circuitry between the graphic equalizer GEQ and the central processing unit CPU is constructed in a different manner. In FIG. 8, the reference INV is a phase inverter, ADDa is an adder, RFC1 and RFC2 are rectifier-smoothing circuits, and COMP is a comparator.

The adder ADDa is responsive to an output signal from the graphic equalizer GEQ and to an output signal from the phase inverter INV which is responsive to an output signal from the anti-aliasing filter AAF. The output signal from the anti-aliasing filter AAF is also fed to the absolute value detector AVD and the sign detector SD in the same manner as in the embodiment of FIG. 1A. The output signal from the anti-aliasing filter AAF is also fed to a first rectifier-smoothing circuit RFC1, while an output signal from the adder ADDa is fed to a second rectifier-smoothing circuit RFC2. Output signals from the first and second rectifier-smoothing circuits RFC1 and RFC2 are fed to input terminals of the comparator COMP whose output is fed to the central processing unit CPU.

Since the output signal from the anti-aliasing filter AAF is applied to the phase inverter INV, the output signal components from the adder ADDa equal signal components obtained by subtracting signal components, which have been removed by the anti-aliasing filter AAF, from the input audio signal. In other words, the output signal components from the anti-aliasing filter AAF are the same as signal components which would have been obtained by a high pass filter when the input audio signal is applied thereto (see pass band characteristic shown by a dotted curve in FIG. 7).

The first rectifier-smoothing circuit RFC1 rectifies and smoothes the output signal from the anti-aliasing filter AAF, namely signal components indicated by the solid curve in FIG. 7 within the input audio signal, while the second rectifier-smoothing circuit RFC2 rectifies and smoothes the signal components obtained by subtracting signal components, which have been removed by the anti-aliasing filter AAF, from the input audio signal, namely, signal components indicated at the dotted curve in FIG. 7.

The output signals from the first and second rectifier-smoothing circuits RFC1 and RFC2 are respectively fed to the comparator COMP to be compared therein with each other. Namely, the amplitude of the solid curve band in FIG. 7 is compared with that of the dotted curve band. Thus, the comparator COPM outputs the result of the comparison. When the amplitude of the output signal from the second rectifier-smoothing circuit RFC2 is greater than that of the output signal from the first rectifier-smoothing circuit RFC1, the output signal from the comparator COMP will be used to prohibit the transmission of pattern data from the central processing unit CPU via the video display processor VDP to the video RAM V.RAM. Therefore, when the input audio signal includes frequency components whose frequency is higher than the cutoff frequency fc of the anti-aliasing filter AAF, the result of frequency analysis is not displayed on the screen of the display unit CRT. As a result erroneous results of frequency analysis, and therefore erroneous determination of sound pitch is avoided.

In FIG. 8, the output signal from the comparator COMP is fed to a terminal of the central processing unit CPU, which terminal is labeled INT2. This means that in the case that the central processing unit CPU is capable of executing a plurality of interrupt service routines as the above-mentioned TI's TMS9995, the above-described operation for prohibition of indication is executed with a second priority among a plurality of interrupt service routines.

In the above embodiment of FIG. 8, although the amplitude of signal components which have been passed through the anti-aliasing filter AAF is compared with the amplitude of signal components which have been removed by the anti-aliasing filter AAF for the prohibition of indication of erroneous musical notes, other arrangement may be possible for the same purpose. Namely, a band pass filter, which is capable of extracting signal components of frequencies around the cutoff frequency fc within a frequency higher than the cutoff frequency fc, may be used such that the band pass filter is responsive to the output signal from the graphic equalizer GEQ. When such a band pass filter is used, the phase inverter INV and the adder ADDa are unnecessary, and therefore the output signal from the band pass filter is applied to the second rectififer-smoothing ciruit RFC2.

Figure 9A:
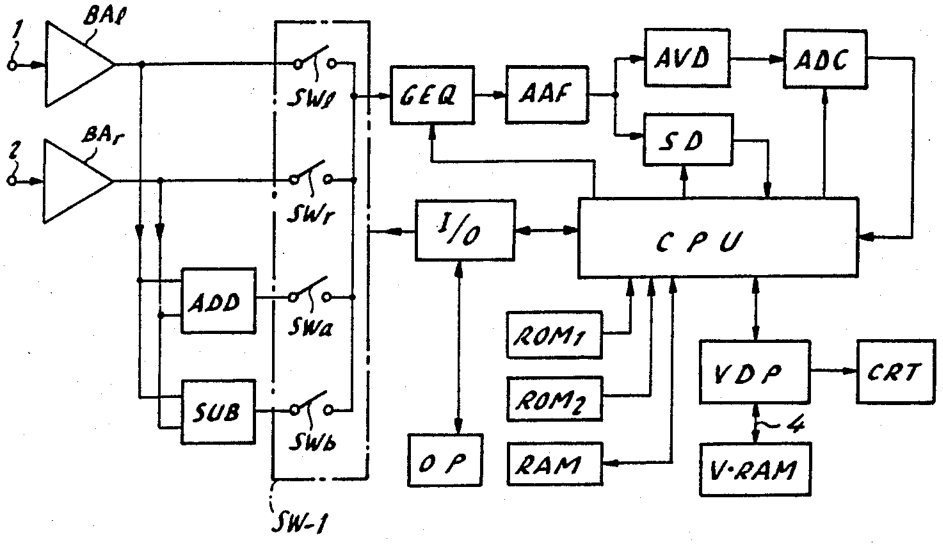
FIG. 9A is a schematic block diagram of a third embodiment of the musical note display device according to the present invention.

Reference is now made to FIG. 9A which shows another embodiment of the musical note display device according to the present invention. The circuit arrangement of FIG. 9A comprises a manipulating or operating portion OP having a plurality of push-buttons or manually operable switches, and an input-output port I/O responsive to signals from the manipulating portion OP. The push-buttons or switches of the manipulating portion OP may be depressed or turned to give instructions to the central processing unit CPU so that the switching circuit SW-1 is controlled to select one of its four input signals. Namely, output signals from the manipulation portion OP are processed by the input-output port I/O, and necessary signals are applied to the central processing unit CPU to produce a switching control signal which is applied via the input-output port I/O to the switching circuit SW-1. As the input-output port I/O may be used an IC known as UPD8255AC manufactured by Nippon Electric Co., Ltd. This IC comprises a plurality of terminals for inputting and outputting data therethrough, and latches inputted data. In order to selectively close one of the switches SWl, SWr, SWa, and SWb of the switching circuit SW, output data from the IC is applied to the switching circuit SW-1 such that respective bits at respective output terminals are set to either logic "1" or "0".

Figure 9B:
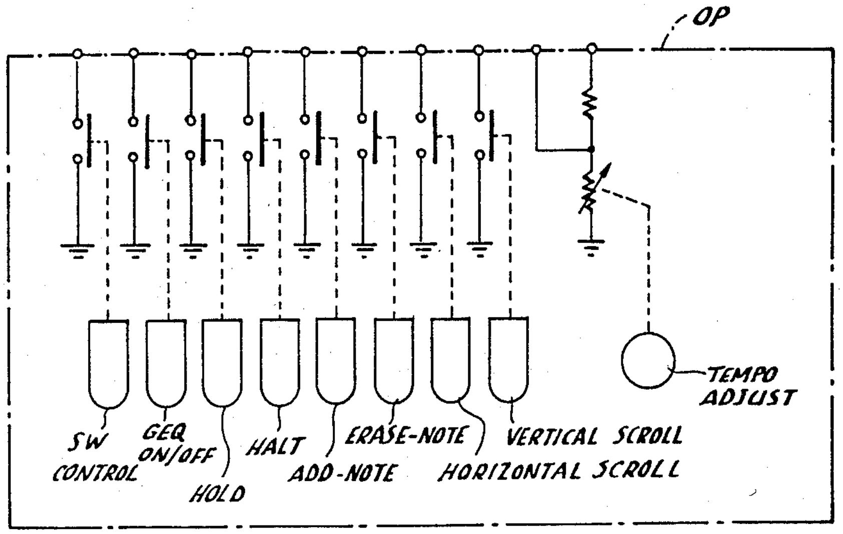
FIG. 9B is a diagram showing the manipulating portion shown in FIG. 9A.

Furthermore, other push-buttons or switches of the manipulating portion OP manner be provided to control the way of displaying musical notes on the screen of the display unit CRT. Namely, output signals from the manipulation portion OP are processed by the input-output port I/O to be applied to the central processing unit CPU to select a desired manner of displaying. To this end buttons respectively labeled HOLD, HALT, ADD-NOTE, ERASE-NOTE, HORIZONTAL-SCROLL, and VERTICAL-SCROLL are provided, as shown in FIG. 9B, to the manipulation portion OP. The HOLD button may be depressed when the user or operator of the display device wishes to watch a stationary picture on the display unit screen rather than a time-to-time changing picture. Namely, when the HOLD button is depressed, the diplayed musical notes are fixed as they are so that no subsequent sound pitch is indicated on the screen. The HALT button may be depressed with it is intended to put the display device in HALT mode in which a single note can be either added or erased. To add only a single note representing sound pitch the ADD-NOTE button is depressed, and to erase or delete a single already displayed note from the staff the ERASE-NOTE button is depressed. The HALT mode may be used when composing or writing music by singing or playing a musical instrument. Namely, when it is intended to cancel or erase a newset note, the ERASE-NOTE button is depressed with the HALT button being depressed in advance. On the other hand, when it is intended to see a note corresponding to a particular sound pitch which will be emitted, the ADD-NOTE button is depressed at an instant where visual recognition is intended.

The HORIZONTAL-SCROLL and VERTICAL-SCROLL buttons may be depressed when it is intended to indicate musical notes on the displayed staff with the aformentioned scroll mode. Namely, when the HORIZONTAL SCROLL BUTTON is depressed, notes are consecutively displayed such that each new note is added at the right of the staff after the staff is filled with 26 notes, while the oldest note disappears from the left end with all the notes being shifted toward the left. In the case that the VERTICAL SCROLL button is depressed, two staffs with treble clef appear on the screen so that notes on the lower staff are simultaneously shifted to the upper staff when both the upper and lower staffs are filled with notes.

Various data or instructions inputted via the manipulating portion OP may be processed by the central processing unit CPU to selectively energize one or more light-emitting diodes which may be provided to indicate various modes of the operation of the note display device.

The embodiment of FIG. 9A also comprises a connection between the central processing unit CPU and the graphic equalizer GEQ so that operating mode of the graphic equalizer GEQ is controlled by an instruction from the central processing unit CPU, which instruction may be originally inputted from a key or switch included in the manipulating portion OP. Such a key or switch may be referred to as a GEQ on/off switch since the input and output terminals of the graphic equalizer GEQ is shorted when this GEQ on/-off switch is turned on. Namely, when the GEQ on/off switch is turned off, a signal therefrom is applied via the input-output port I/O to the central processing unit CPU to generate a switching signal with which the input and output terminals of the graphic equalizer are connected to each other. As a result, the graphic equalizer GEQ is disabled to directly transmit the audio signal from the switching circuit SW-1 to the anti-aliasing filter AAF without giving any attenuation. On the other hand, when the GEQ on/off switch is turned on, the graphic equalizer GEQ is enabled by disconnecting the above-mentioned short circuit, and therefore, necessary attenuation is given for respective frequency values.

Figure 10:
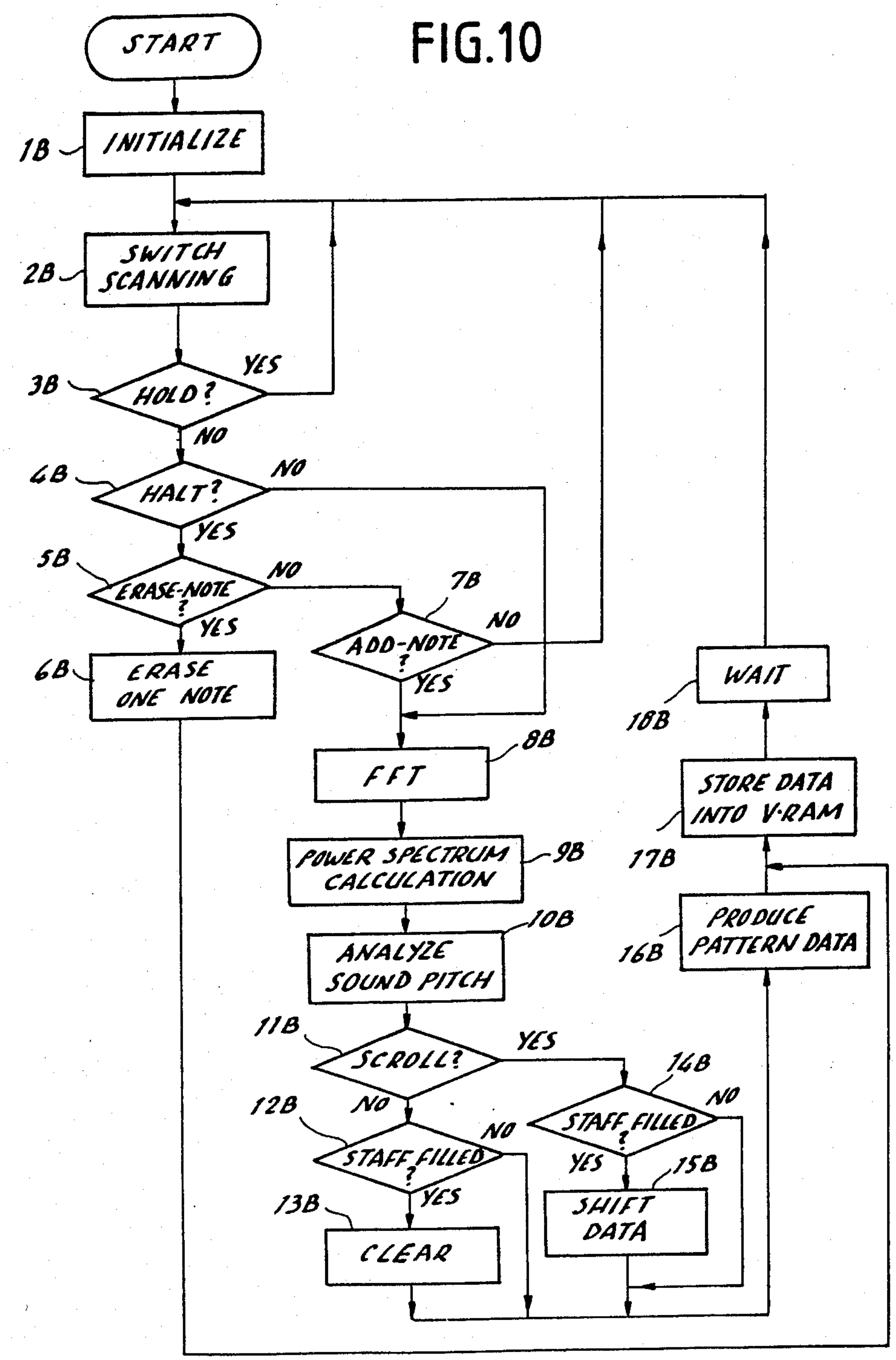
FIG. 10 is a flow chart showing the operation of the central processing unit used in the embodiment of FIG. 9A.

The central processing unit CPU of FIG. 9A is arranged to operate in accordance with a program stored in the read-only memory ROM1 as will be described with reference to flow chart of FIG. 10 showing a main routine for the operation of the central processing unit CPU of FIG. 9A.

In the main routine of FIG. 10, the central processing unit CPU repeatedly executes STEPs 2B through 18B unless interruption occurs. When interruption occurs in response to the count of the internal counter of the central processing unit CPU, the execution of the main routine is interrupted to execute the interrupt service routine. Since the interrupt service routine is the same as that of FIG. 6B, description thereof is omitted. In a STEP 2B of the main routine, switch scanning is effected to see which switch(es) or button(s) of the manipulating portion OP is/are depressed, and the result of switch scanning is stored in the main memory RAM. In a following STEP 3B, it is checked if the HOLD button has been depressed. In other words, it is determined whether the user of the musical note display device intends to fix the picture on the display unit screen. If the determination in the STEP 3B is NO, a STEP 4B is executed. On the contrary, if YES, the STEPs 2B and 3B are executed again. Therefore, STEP 3B is repeatedly executed until the HOLD button is turned off or depressed again to cancel the holding state.

In STEP 4B, it is determined whether the HALT button has been depressed. If the determination in STEP 4B is NO, STEPs 8B, 9B and 10B are executed in sequence. These STEPs 8B through 10B respectively correspond to STEPs 2A through 4A of FIG. 6A such that the STEP 10B includes steps equal to the STEPS 4A and 5A, and therefore description thereof is omitted. On the other hand, if the determination is YES in the STEP 4B, STEP 5B is executed to determine whether the ERASE-NOTE button has been depressed. If NO, a STEP 7B is executed to see whether the ADD-NOTE button has been depressed. On the other hand, if the determination in the STEP 5B is YES, a STEP 6B takes place to erase the newest note on the staff. In order to erase the newest note, i.e. the rightmost note on the staff representing sound pitch given before the ERASE-NOTE button has been depressed, the contents of the video RAM V.RAM are written such that data indicative of the newest note is cancelled. Namely, the pattern data for te newest note is replaced with an initial pattern representing the staff, i.e. a horizontal line or space each having a predetermined width.

Turning back to the STEP 7B, if the determination therein is NO, namely when the ADD-NOTE button has not been depressed, the operational flow goes back to the STEP 2B. On the other hand, if the ADD-NOTE button has been depressed, the above-mentioned STEPs 8B through 10B are executed. After execution of the STEP 10B, STEPs 16B through 18B will be executed via STEPs 11B through 13B or STEPs 14B and 15B. The STEPs 16B and 17B respectively correspond to the STEPs 6 and 7 of FIG. 6A, and therefore description thereof is omitted.

When STEP 7B is executed, data stored in the main memory RAM representing that the ADD-NOTE button was depressed, is cancelled. Therefore, when STEP 7B is executed again after one cycle of the main routine, the determination in the STEP 7B results in NO. As a result, STEPs 2B through 5B and 7B are repeatedly executed until the HALT button is turned off or the ERASE-NOTE button is depressed. With this operation therefore, only a single new note is added to the right of the already-displayed notes. This manner of either adding a single note representing sound pitch at a selected and desired timing, or erasing a single note which is already displayed, is useful when composing music since each note can be manually added or cancelled at will. The above-mentioned ERASE-NOTE button may be depressed a plurality of times for erasing a plurality of notes one by one.

In STEP 11B, it is determined whether the SCROLL button has been depressed. Although it has been described that the manipulating portion OP comprises HORIZONTAL-SCROLL button and VERTICAL-SCROLL button, let us assume that one of such SCROLL buttons is provided for simplicity. Suppose the HORIZONTAL-SCROLL button has not been depressed, then the determination in the STEP 11B results in NO. The SCROLL button is to be depressed when it is intended to select scroll mode as a way of indication of notes on the staff. Therefore, when such a scroll mode is not desired, the SCROLL button is not depressed. Thus STEP 12B is executed to see if the displayed staff is filled with notes. In the case that 26 notes can be indicated simultaneously on the parallel staff with treble clef and bass clef, it is checked whether the number of displayed notes equals 26 or not. If the number of notes is less than 26, namely if the staff is not yet filled with notes, the determination in STEP 12B becomes NO, and STEP 16B is subsequently executed to add a subsequent note in response to coming sound. However, if the staff has been filled with 26 notes, STEP 13B is executed to clear all the notes on the staff simultaneously since there is no room for the subsequent note. In detail, data within the video RAM V.RAM is all substituted with initial data representing a segment of a horizontal line or space constituting a portion of the staff. After execution of STEP 13B, STEP 16B is executed so that the subsequent note will be indicated at the left of the staff from which all the previously indicated notes have been erased. In this way, notes are added one by one until 26 notes are displayed on the staff, and when a second group or set of 26 notes are diplayed on the screen, STEPs 12B and 13B will be executed again to clear the notes in the same manner as the above. The above-mentioned way of indication of notes is referred to as repetitive display mode since each set of 26 notes is indicated in sequence such that the staff is renewed by clearing all the previously shown notes simultaneously to repeat indication of subsequent notes.

Turning back to the STEP 11B, when the HORIZONTAL-SCROLL button has been depressed, the STEP 14B is executed in which it is determined whether the displayed staff is filled with 26 notes in the same manner as in the STEP 12B. If the staff is not yet filled with 26 notes, the determination in STEP 14B results in NO, and then STEP 16B follows to add a subsequent note. On the other hand, if the staff is filled with 26 notes, STEP 15B is executed to shift all the notes on the staff to the left by a distance corresponding to an interval between two consecutive notes. As a result, the oldest note at the left end is erased to provide an empty space at the left end, for a subsequent note. To this end data within the video RAM V.RAM, indicative of respective notes is tranferred or shifted one by one so that the above-mentioned shifting of the notes is achieved. After shifting in STEP 15B, STEP 16B is executed to add a subsequent note at the right end space, which has been just provided by the shifting of notes to the left. In this way when the HORIZONTAL-SCROLL button has been depressed, subsequent notes are added at the right of the staff one by one, while all the displayed notes are shifted to the left.

Figure 11:
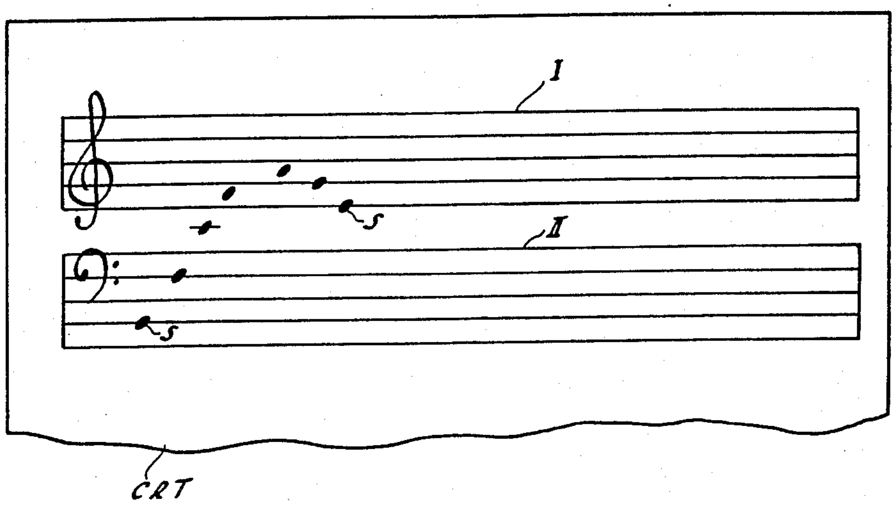
FIGS. 11 and 12 are explanatory diagrams useful for understanding the operation of the embodiment of FIG. 9A.
Figure 12:
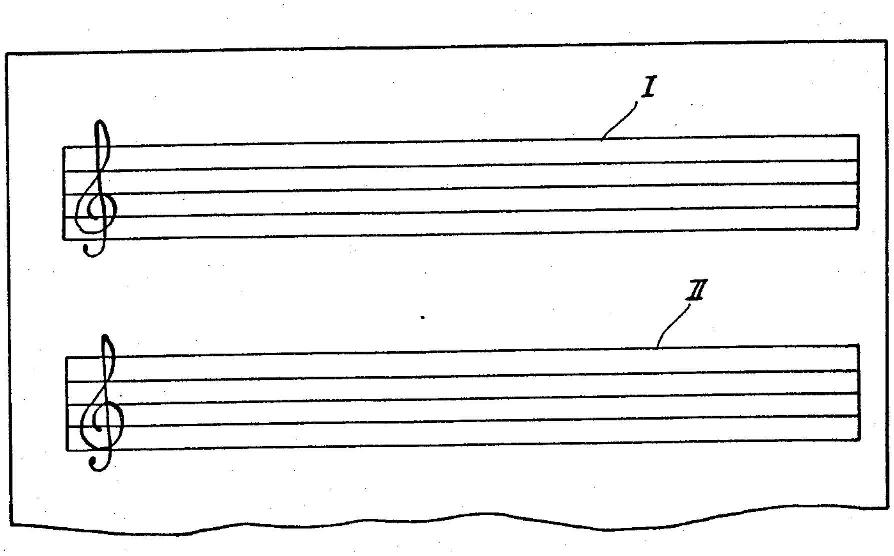

FIG. 11 shows a displayed picture having upper and lower staffs I and II with treble clef and bass clef respectively. The above-mentioned horizontal scroll mode may be effected with the staff pattern of FIG. 11. However, the manner of indication of notes by using a technique for scroll is not limited to such a horizontal scroll. Namely, when a plurality of staffs with the same clef, such as treble clef, are shown on the screen of the display unit CRT as shown in FIG. 12, vertical scroll mode can be achieved. Assuming that each of the upper and lower staffs I and II has a capacity of 26 notes, after 26 notes are indicated on the upper staff I, subsequent notes may be displayed on the lower staff II with the notes on the upper staff I being kept as they are. When the lower staff II is filled with 26 notes, namely when 52 notes are shown on the screen simultaneously, the notes on the lower staff II can be simultaneously shifted to the upper staff I with the already displayed notes on the upper staff being erased. Such vertical scroll mode may be readily effected by using steps similar to STEPs 14B and 15B. In detail, STEP 14B may be changed so that it is checked to see if 52 notes are indicated, and if YES, data corresponding to the notes of the lower staff II is simultaneously shifted to appropriate address for shifting the notes of the lower staff II to the upper staff I.

Although the flow chart of FIG. 10 includes steps for enabling one of the vertical scroll and horizontal scroll modes, both scroll modes may be selectively used by adding steps similar to STEPS 11B to 15B. With such a program including steps for both vertical and horizontal scroll modes, the above-mentioned VERTICAL-SCROLL button or HORIZONTAL-SCROLL button may be selectively depressed to select one. When effecting vertical scroll mode, the number of staffs displayed on the screen may be increased. Furthermore, two or more pairs of staffs with different clefs may be used to allow indication of notes throughout a wide frequency or pitch range, such as 3 octaves as in FIGS. 4 and 11.

After the execution of the STEPs 16B and 17B, the STEP 18B is executed to wait for a given period of time which may be manually adjustable. This STEP 18B for time-waiting is effected for setting a tempo. This point will be described in connection with the time necessary for the execution of the STEPs 2B through 18B. A period of time between an instant of indication of a note and a subsequent instant of indication of a next coming note, is substantially equal to the time length required for the execution of these STEPs 2B through 18B since each note is indicated by the execution of the STEP 17B. Assuming that this time length is 200 milliseconds under a condition that waiting time in the STEP 18B is zero, it takes 5.6 seconds to indicate 26 notes on the displayed staff. Therefore, if the waiting time is set to a value other than zero, an interval between two consecutive notes will be increased. Suppose $\tau$ milliseconds is set as the waiting time in STEP 18B, the interval between two consecutive notes becomes $200+\tau$ milliseconds. As a result, it takes 5.6 seconds$+26\tau$ milliseconds to indicate 26 notes.

From the above, it will be understood that the interval between two consecutive notes can be freely changed by varying the waiting time $\tau$. In order to manually change the waiting time $\tau$, a manually operable time-setting element is employed. As such a time-setting element, there may be used a potentiometer or a push-button type signal generator for changing a preset value for a counter which may be achieved by the program for the execution of the central processing unit CPU. Since the interval between two consecutive notes represents the tempo of the music, the waiting time may be adjusted to a desired tempo.

Figure 13:
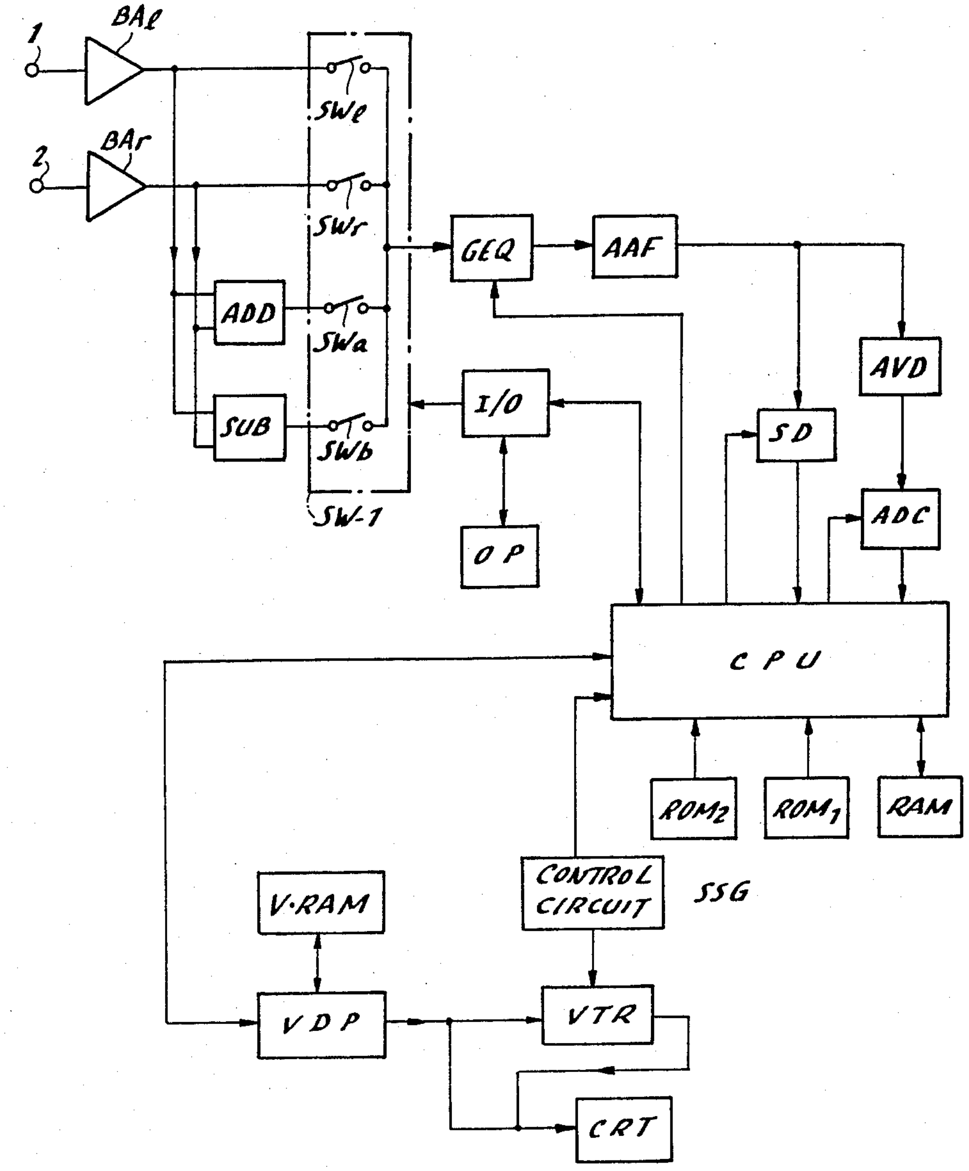
FIG. 13 is a schematic block diagram of a fourth embodiment of the musical note display device according to the present invention.

Referring to FIG. 13, another embodiment of the musical note display device according to the present invention will be described. The embodiment of FIG. 13 differs from the embodiment of FIG. 9A in that it comprises an external recording device-control circuit SSG. In this embodiment, it is intended to record the data for the indication of notes on a recording medium such as a magnetic recording tape. In the illustrated embodiment, a video tape recorder VTR is used as an external recording device, and therefore data representing notes is recorded magnetically. Assuming that the note display device of FIG. 9A is put in the above-mentioned repetitive display mode, when all the 26 notes are arranged on the staff as shown in FIG. 4, the video signal from the video display processor VDP is recorded by the video tape recorder so that data indicative of a single frame of the displayed picture is permanently stored. Such recording is effected repeatedly each time the staff is filled with 26 notes. In other words, recording is done before all the displayed notes are erased in STEP 13B in the flow chart of FIG. 10. Thus, the external recording device-control circuit SSG is arranged to receive a record-instruction after STEP 12B.

However, as soon as it is detected that the staff is filled with 26 notes in STEP 12B, all the data in the video RAM V.RAM is replaced with initial pattern data in the following STEP 13B to clear the notes as described above. As a result, it is impossible to record data representing all 26 notes from the video RAM V.RAM on a magnetic tape within the video tape recorder VTR since it takes a half-second or so to record the same. In other words, the data of the video RAM V.RAM has to be maintained for a given period of time so that the video tape recorder VTR can record the data from the video RAM V.RAM. To this end, the storing region within the video RAM V.RAM is divided into two sections which are referred to as section I and section II. Suppose that section I is filled with data of 26 notes, this is detected in STEP 12B, and then the contents of the other section, i.e. section II, is cleared in STEP 13B. As a result, the data of section I is not cleared immediately after STEP 12B in this case. Therefore, the data of section I can be derived and recorded by video tape recorder VTR. When section II is filled with data for the next 26 notes, the data stored in section I is then cleared. In this way, sections I and II are alternately used by periodically resetting the register of the video display processor VDP. Namely, as soon as recording of a single picture including 26 notes terminates, the register of the video display processor is reset to switch between sections I and II. When section I is used to store data therein, the contents of section II are read out to display musical notes on the screen. On the other hand, when section II is used to store data therein, the contents of section I are read out in the same manner. If the capacity of the video RAM V.RAM is too small to provide two sections as in the above, two separate video RAMs may be used instead.

The external recording device-control circuit SSG is arranged so that it normally produces a PAUSE signal with which the video tape recorder VTR is put in PAUSE mode, and it also produces a RECORD signal with which the video tape recorder VTR is caused to start recording. Such PAUSE and RECORD signals may be applied to a remote-control terminal of the video tape recorder VTR. In this way the video tape recorder is intermittently put in recording mode to record respective pictures each including 26 notes on the staff. Therefore, when a music piece is played, a number of pictures contstituting the entire music sheets representing the pitches of varying sounds within the music piece are recorded on the magnetic tape. Thus, when playing back the recorded video tape, the entire staff, showing the beginning to the end of the played music, can be visually seen on the screen of the display unit arranged to receive output video signals from the video tape recorder VTR. It is preferable to add various information of the played music to the picture to be recorded. For instance, name of music, tempo, page of music sheet or the like may also be added to the picture of the staff so that recorded music notes will be effectively used when played back.

In the embodiment of FIG. 13, although the displayed staffs are magnetically recorded to be reproduced on a display unit when necessary, if a known color printer responsive to a video signal is connected to the video display processor VDP, hard copies of displayed music sheets may be readily obtained.

With the musical note display device according to the present invention, while it is possible to produce music sheets with the operation of the musical note display device when a player plays a musical instrument, the notes indicated on the staffs of the music sheets are not necessarily correct if a reference sound pitch of the musical instrument differs from a reference sound pitch within the musical note display device. Namely, although the musical note display device uses sound pitch of pitch name A4, i.e. sound having a frequency of 440 Hz which is a standard frequency assigned to pitch name A4, the sound pitch of pitch name A4 emitted from various musical instruments are not necessarily equal to 440 Hz. As a matter of fact sound pitch emitted from most musical instruments as a reference pitch of sound pitch A4 is usually different from 440 Hz more or less. Therefore, when sound from such a musical instrument or vocal sound from a human being is processed by the musical note display device, such as those previously described, the position of each note on the displayed staff would differ from that written by the composer of the music.

Figure 14A:
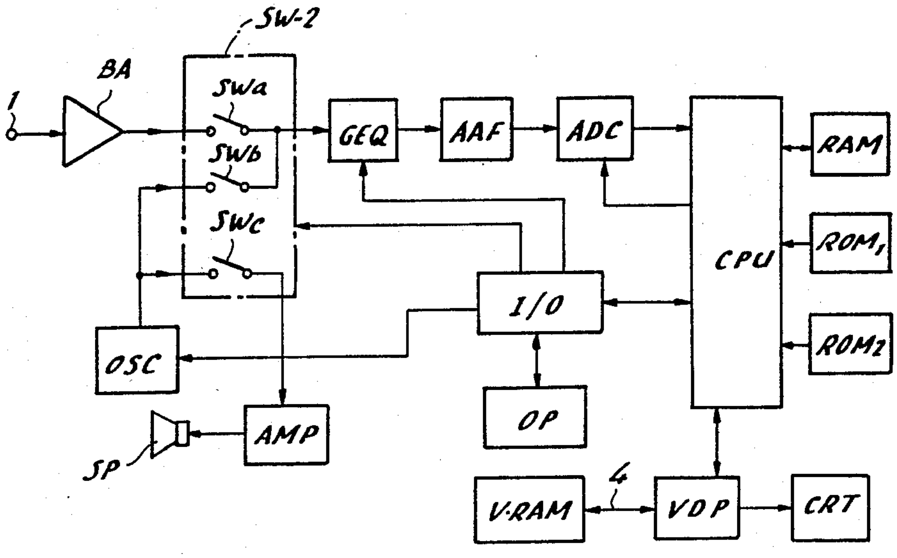
FIG. 14A is a schematic block diagram of a fifth embodiment of the musical note display device according to the present invention.

FIG. 14A shows another embodiment of the musical note display device according to the present invention, which embodiment is capable of accurately positioning musical notes even if a reference pitch of sound of an input audio signal differs from the standard pitch. The circuit arrangement illustrated in FIG. 14A comprises a reference signal oscillator OSC which is capable of oscillating at a variable frequency within an audio frequency range, an amplifier AMP and a speaker SP. In FIG. 14A, only a single input terminal 1 is shown for simplicity. Namely, it is also possible to provide two input terminals 1 and 2, and following circuits as in previous embodiments. A switching circuit SW-2 comprises three switches SWa, SWb and SWc. The switch SWa is used to send an input audio signal from the output terminal of a buffer amplifier BA, while the switch SWb is used to send the reference signal from the oscillator OSC to the graphic equalizer GEQ. The switch SWc is used to send the reference signal from the oscillator OSC to the amplifier AMP which drives the speaker SP. These switches SWa, SWb and SWc are controlled by the switch control signal from the input-output port I/O in the same manner as in FIG. 13.

The reference signal oscillator OSC is arranged to produce an output sinusoidal signal whose frequency is variable in accordance with a frequency-control signal from the input-output port I/O. Namely, the manipulating portion OP comprises a button or knob for manually controlling the oscillating frequency of the oscillator OSC so that the oscillator OSC oscillates at a desired frequency such as 440 Hz corresponding to pitch name A4, 261.63 Hz corresponding to pitch name C4 and so on. However, this does not mean that the oscillator OSC can produce only such predetermined frequency signals. In other words, the oscillator OSC is capable of oscillating at any desired frequency within an audio frequency range so that the reference signal therefrom may be used within the musical note display device of FIG. 14A for changing a standard frequency or pitch for a predetermined pitch name such that a reference pitch within the musical note display device equals the pitch of sound of an input audio signal emitted as a reference pitch as will be described hereinafter. Furthermore, the oscillator OSC may also be used for tuning a musical instrument or so.

The central processing unit CPU of the display device of FIG. 14A executes a program in accordance with instructions stored in the read-only memory ROM2. Namely, the central processing unit CPU executes a main routine shown in FIG. 15 and an interrupt service routine which is substantially the same as that shown in FIG. 6B. In the main routine of FIG. 15, steps labeled in the same manner as in FIG. 6A are substantially the same as those in FIG. 6, and description of such steps is omitted.

Figure 14B:
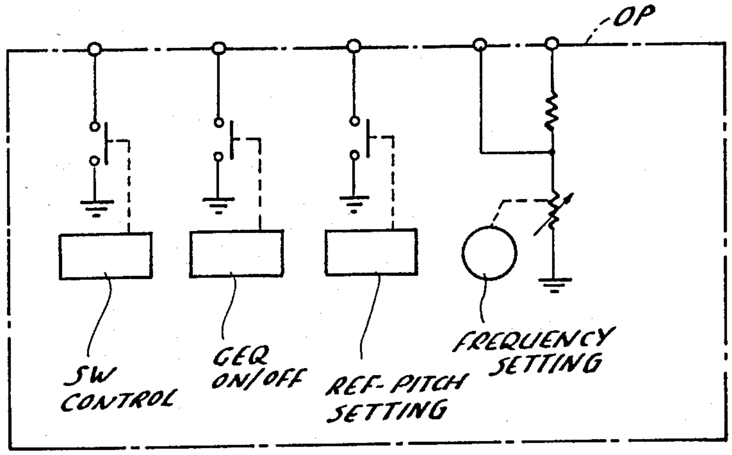
FIG. 14B is a diagram showing the manipulating portion shown in FIG. 14A.

In a STEP 2C, switch scanning is effected to see which switch or button of the manipulating portion OP has been depressed. The manipulating portion OP comprises a button labeled REF-PITCH-SETTING as shown in FIG. 14B, with which the musical note display device is put in a reference pitch setting mode. Namely, when the REF-PITCH-BUTTON has been depressed, data indicative of such mode is stored in the main memory RAM. This data is read out in a STEP 5C to see if the user of the musical note display device intends to perform setting of a reference pitch. If the determination in STEP 5C is NO, namely, if the REF-PITCH-BUTTON has not been depressed, a STEP 8C is executed to analyze the pitch of the input audio signal in the same manner as in previous embodiments.

On the other hand, if the determination in STEP 5C is YES, a step 6C is executed to determine the pitch of an input audio signal or the reference signal from the oscillator OSC. Namely, when it is intended to change the reference pitch set within the musical note display device, the user first depresses the above-mentioned REF-PITCH-SETTING button, and then produces a reference pitch signal by way of a desired musical instrument or the reference signal oscillator OSC. Taking an example of setting a reference pitch to the display device by producing sound by a musical instrument, which sound is considered by the player as a reference pitch, the pitch of the sound from the musical instrument is determined by the STEP 6C. To this end the switch SWa is turned on while the switches SWb and SWc are turned off in advance. The pitch detected in STEP 6C will be then used in a STEP 7C to change the sampling frequency or period which is preset in the internal counter. Namely, the sampling frequency fs of the sampling pulses used on AD conversion by the AD converter ADC is changed in accordance with the pitch detected in the STEP 6C.

Assuming that the frequency of the sound emitted from a musical instrument or vocal sound from a human being as a reference pitch of pitch name A4, is higher than the standard reference frequency, i.e. 440 Hz, preset in the musical note display device by $\alpha$ percent, the sampling frequency to be set in the STEP 7C is made higher than an initially set sampling frequency by $\alpha$ percent. On the other hand if the frequency of the input audio signal given as the reference pitch sound of pitch name A4 is lower than the standard reference frequency by $\alpha$ percent, the sampling frequency is made lower than the initially set sampling frequency by $\alpha$ percent. In this way, the sampling frequency for AD conversion is changed in accordance with the pitch of the audio signal inputted as a reference pitch in the reference pitch setting mode.

As described in connection with the first embodiment of FIG. 1A, the number of digital data used for FFT operation is predetermined, while the order of each data corresponds to each frequency such that 220th data corresponds to 440 Hz when single data represents 2 Hz. Therefore, when the sampling frequency fs is changed from the initially set value, the correspondence between the order of data within the predetermined number of digital data and frequencies is also changed in proportion to the amount of change in the sampling frequency.

After the sampling frequency fs is suitably adjusted in the above-described manner, the reference pitch of the input audio signal, which is either higher or lower than the reference pitch within the musical note display device, will be detected and used, such that as if the reference pitch within the musical note display device were made equal to the reference pitch of the input audio signal, since the relationship or correspondence between the order of data within the predetermined number of digital data and frequencies has been shifted by the change in the sampling frequency fs. In this way reference pitch setting is effected, and then the REF-PITCH-SETTING button may be turned off to start the indication of notes representing the pitch of each input sound. Namely, after the REF-PITCH-SETTING button is turned off, the determination in STEP 5C results in NO to execute STEPs 8C through 10C.

In the above description, although a musical instrument or vocal sound is used to effect reference pitch setting, the reference signal from the oscillator OSC may be used in place of such audio signals. Since the reference signal from the oscillator OSC is a sinusoidal wave, extremely accurate frequency analysis therefor is insured. In order to use the reference signal from the oscillator OSC, the switch SWc is first closed to emit the sound of the reference signal from the speaker SP. At this time, the oscillating frequency may be manually adjusted by manipulating the above-mentioned FREQUENCY-SETTING knob of the manipulating portion OP so that the oscillating frequency equals the frequency or pitch of sound from a musical instrument or vocal sound produced as a reference pitch sound. After the frequency of the reference signal from the oscillator is determined in this way, the switch SWb is closed and simultaneously the switch SWa is rendered open. The REF-PITCH-SETTING button is depressed to execute STEPs 6C and 7C of FIG. 15 in the same manner as described above.

The oscillator OSC may also be used to tune musical instruments by the comparison between the sound from the speaker SP and the sound from each musical instrument so that the reference pitch of a musical instrument equals a selected pitch manually set by the FREQUENCY-SETTING knob.

After the musical instrument is tuned by using the reference signal from the speaker SP, the reference signal from the oscillator OSC may be used for the above-mentioned reference pitch setting. When the reference pitch within the musical note display device is set in this way, the display device is then capable of accurately indicating each pitch of each sound by positioning each note at a right position on the displayed staff. Especially, when it is intended to tune musical instruments such that their reference pitch equals the standard pitch in which pitch name A4 equals 440 Hz, the reference signal from the speaker SP may be effectively and conveniently used. In the case that musical instruments are tuned to the standard pitch, the REF-PITCH-SETTING button need not be depressed since the standard pitch equals the reference pitch preset in the musical note display device.

Figure 15:
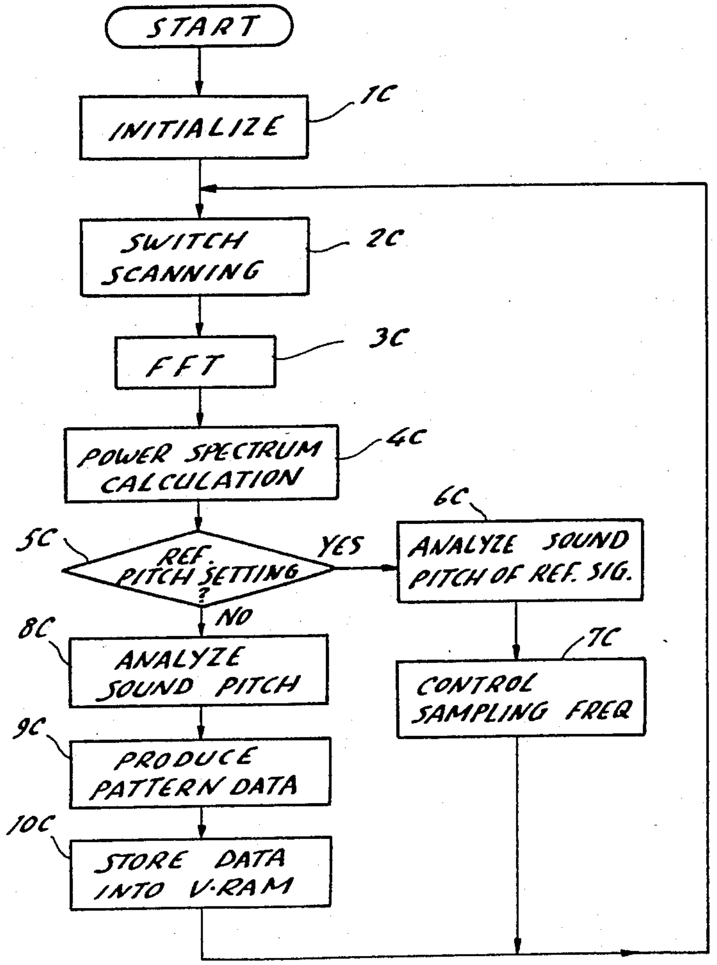
FIG. 15 is a flow chart showing the operation of the central processing unit used in the embodiment of FIG. 14A.

From the above it will be understood that the embodiment of FIGS. 14A and 15 may be used in two ways, one being pitch setting within the dispaly device to the reference pitch of a musical instrument or the like, and the other being tuning of a musical instrument or the like to a desired pitch which may be manually set.

Another embodiment, which is a modification of the above-described embodiment of FIGS. 14A and 15, will be described with reference to FIGS. 16 and 17. In the circuit arrangement shown in FIG. 16, a clock pulse generator CSG is provided instead of the reference signal oscillator OSC of FIG. 14A. The clock pulse generator CSG is equipped with a variable resistor which is manually operable so that the oscillating frequency therefrom can be manually adjusted. The output clock pulse signal Sc from the clock pulse generator CSG is applied to a terminal CRU of the central processing unit CPU, and to an input terminal of a frequency divider DIV. The frequency divider DIV is arranged to divide the frequency of the clock pulse signal Sc by a plurality of numbers for producing a plurality of frequency-divided output signals Sh, Ss and Sl. These plurality of output signals from the frequency divider DIV are fed to terminals of a switch SW-3 so that one of them is selectively fed via a filter FL to an amplifier AMP.

As the frequency divider DIV, there may be used an up-down counter. The clock pulse signal fed to the central processing unit CPU will be used to alter the sampling frequency fs used for AD conversion as will be decribed with reference to the flow chart of FIG. 17. The frequency of the clock pulse signal Sc may be determined such that the signal Ss from the frequency divider DIV equals 440 Hz, i.e sound of pitch name A4, when the variable resistor VR of the clock pulse generator CSG is set to a midway value within the range of variation. When the frequency of the clock pulse signal Sc is expressed in terms of fcp, the frequency divider DIV may be arranged to produce the above-mentioned three output signals Sh, Ss and Sl respectively, having frequencies expressed by fcp/n, fcp/2n and fcp/4n wherein n is a constant. Therefore, when the frequency of the signal Ss equals 440 Hz, i.e. pitch name A4, the frequency of the signal Sh equals 880 Hz, i.e. pitch name A5, and the frequency of the signal Sl equals 220 Hz, i.e. pitch name A3. Therefore, when these signals Sh, Ss and Sl are selectively given to the amplifier AMP to produce corresponding sounds from the speaker SP, three different pitch sounds can be obtained where the highest pitch is higher than a middle pitch by one octave, and the lowest pitch is lower than the middle pitch by one octave.

When the variable resistor VR is adjusted to either raise or lower the pitch from a standard pitch, the frequency fcp of the clock pulse signal Sc varies as $fcp+\Delta f$ or $fcp-\Delta f$. Accordingly, the frequencies of the output signals Sh, Ss and Sl also change with the relationship therebetween being maintained. Namely, the signals Ss and Sh are always harmonic overtones of the signal Sl.

On the other hand, the clock pulse signal Sc is used to change the sampling frequency fs in accordance with the ferquency or period of the clock pulse signal Sc. Namely, when the frequency fcp of the clock pulse is set such that the frequency of the signal Ss equals 440

Hz (pitch name A4), the sampling frequency fs is unchanged from its initially set value, and as the frequency fcp raises or lowers, the sampling frequency fs is changed such that the sampling frequency increases or decreases by α percent when fcp increases or decreases by α percent.

Figure 16:
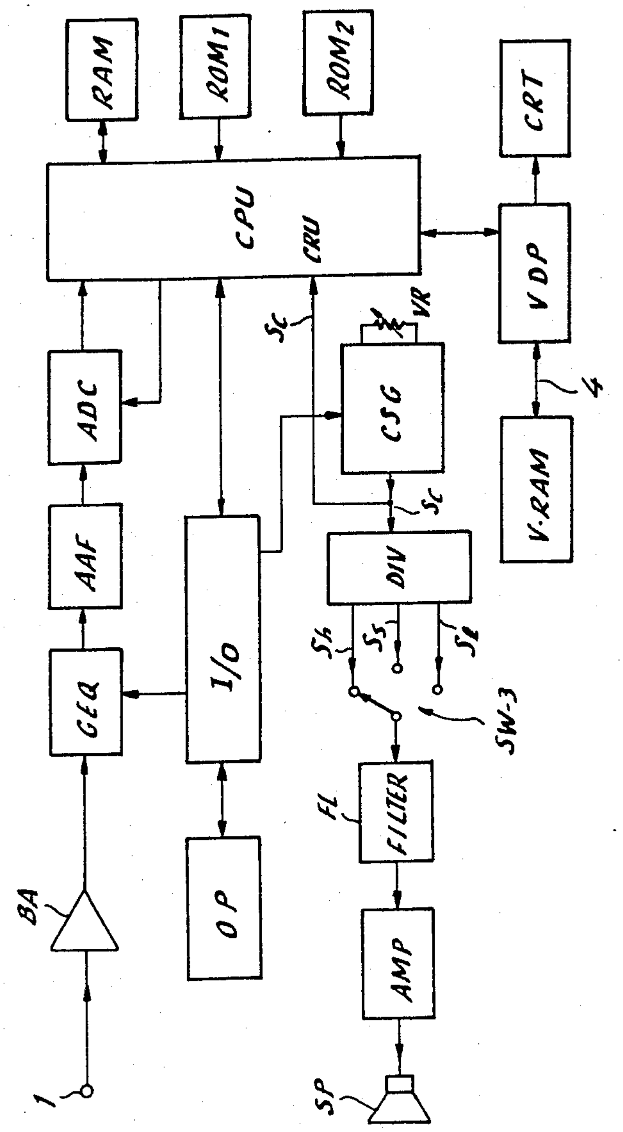
FIG. 16 is a schematic block diagram of a sixth embodiment of the musical note display device according to the present invention.

The embodiment of FIG. 16 may be used to tune a musical instrument or to set a reference pitch for the musical display device in accordance with the reference pitch of a musical instrument or the like in the same manner as in the embodiment of FIG. 14A. In addition, since one of three signals Sh, Ss and Sl may be manually selected, tuning of various musical instruments can be readily effected even if the reference pitch emitted from one musical instrument differs from the reference pitch from another musical instrument by one octave or two octaves. Especially, it is convenient to tune low pitch musical instruments, such as the contrabass, and vocal sound of a male singer.

The clock pulse signal generator CSG is arranged to start operating in response to a signal from the input-output port I/O, which signal is produced when the REF-PITCH SETTING button of the manipulating portion OP is depressed in the same manner as in the embodiment of FIGS. 14A and 14B. Then one of the output signals Sh, Ss and Sl is selected by the manually operable switch SW-3 to be emitted from the speaker SP. A player of a musical instrument then tunes his or her musical instrument by using the emitted reference sound. At this time, the reference pitch sound emitted from the musical instrument is not necessarily equal to the reference pitch within the musical note display device such that the reference pitch emitted as pitch name A4 differs from 440 Hz. Therefore, it is necessary to change the reference pitch within the musical note display device to be equal to the reference pitch from the musical instrument in the same manner as in the embodiment of FIGS. 14A and 15. In order to change the reference pitch within the display device, the sampling frequency fs is changed in the same manner as in the embodiment of FIGS. 14A and 15. However, in the embodiment of FIG. 16, the clock pulse signal Sc is not AD converted to obtain digital data used in FFT operation. Namely, the above-mentioned clock pulse signal Sc is used as a reference signal for controlling the sampling frequency. This point will be described with reference to the flow chart of FIG. 17.

Figure 17:
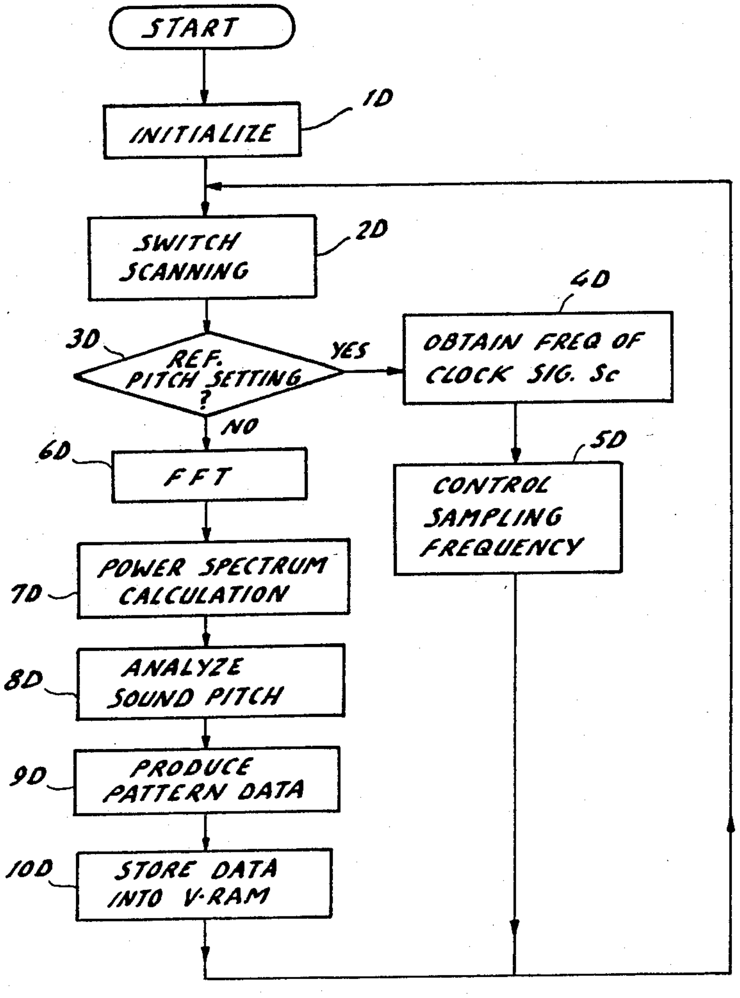
FIG. 17 is a flow chart showing the operation of the central processing unit used in the embodiment of FIG. 16.

FIG. 17 shows a flow chart representing the main routine for the operation of the central processing unit CPU used in the embodiment of FIG. 16. An interrupt service routine, which is substantially the same as that of FIG. 6, is also executed intermittently in the same manner as in the previous embodiments. Although the flow chart of FIG. 17 is similar to that of FIG. 15, a STEP 3D, which corresponds to STEP 5C of FIG. 15, is executed immediately after a STEP 2D corresponding to STEP 2C. Namely, it is checked to see if the REF-PITCH-SETTING button has been depressed in STEP 3D before FFT operation. In the case that the REF-PITCH-SETTING button has been depressed, STEPs 4D and 5D are executed to change the sampling frequency fs in accordance with the frequency or period of the clock pulse signal Sc from the clock pulse generator CSG. In detail, the clock pulse signal Sc is processed by the central processing unit CPU to count the number of pulses per unit time by way of counting means achieved by the program for the central processing unit CPU, and the ferequency or period of the clock pulse Sc is determined from the count. The sampling frequency fs is thus changed in the same manner as in the embodiment of FIGS. 14A and 15. From the above, it will be understood that the clock pulse signal Sc is directly used by the central processing unit CPU without AD conversion and FFT operation.

In this way, the reference pitch within the musical note display device is set to prepare for an indication of musical notes. After the reference pitch is set, the REF-PITCH-SETTING button may be released to start the indication of notes on the displayed staff by analyzing the input audio sound. When the REF-PITCH-RESETTING button is released, the clock pulse generator CSG is disabled, and the speaker SP stops emitting the reference sound. Although it has been described that the display device is switched to the normal musical display mode by releasing the REF-PITCH-SETTING button, another button, which may be labeled as NOTE-INDICATION, may be provided to switch from the reference pitch setting mode to the normal musical note display mode.

In the above described various embodiments, although the musical note display device is used to indicate notes on a displayed staff in response to input audio signals, such as sound from a musical instrument or vocal sounds, the musical note display device according to the present invention may be used for indicating notes in response to audio signals applied from a recording device, such as a tape recorder, a phonograph record player, a video tape recorder, a video disc player and so on. However, when the recorded music is played back at normal reproducing speed, it takes the same time as the playing time of the music to input it to the display device. Therefore, it is desirable if an audio signal recorded in a recording medium is tranmitted to the display device for producing corresponding music sheets within a short period of time. However, when playback speed is simply increased to reduce the playback time, the pitch of the played-back sound is higher than the original pitch, and therefore it is impossible to accurately produce music sheets therefor if the reference pitch within the display device is unchanged. In order to accurately detect the pitch of an audio signal, which is played back at a speed higher than a normal speed, the sampling frequency fs of the sampling pulses used on AD conversion is increased to change the reference pitch as will be described with the following embodiments.

Figure 18:
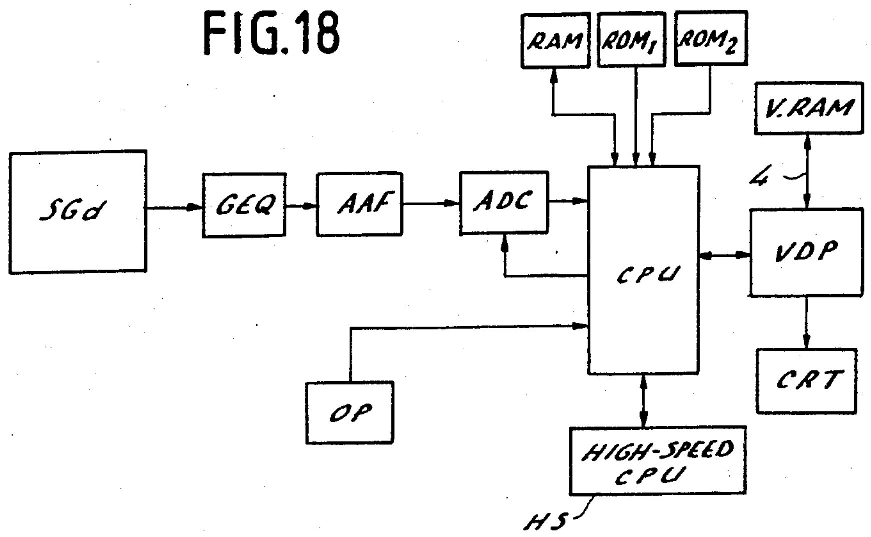
FIGS. 18 and 19 are schematic block diagrams of seventh and eighth embodiments of the musical note display device according to the present invention.

Reference is now made to FIG. 18 showing an embodiment of the musical note display device, which is capable of displaying musical notes on the displyed staff with an objective audio signal being played back at a speed higher than a normal speed. In FIG. 18, the reference SGd is a record/playback device, such as a tape recorder, record player, compact disc player or the like, which is capable of playing back at a speed higher than normal playback speed. Let us assume that a tape recorder is used as the record/playback device SGd, and the playback speed is set to a value of twice the normal playback speed. For instance, in a cassette tape recorder, since the normal playback speed is 4.75 cm/sec, the playback speed is set to 9.5 cm/sec. A tape recorder capable of playing back at a speed higher than the normal speed is then used in a so called double cassette deck arrangement to effect dubbing, i.e. tape-to-tape copy. Before the tape recorder is put in high-speed playback mode, a button in the manipulating portion OP is depressed to inform the central processing unit CPU of the relationship between the normal playback speed and the actual playback speed. In the above case, the user of the display device inputs information indicating that the actual playback speed is twice the normal playback speed. If the record/playback device SGd is a record player, an LP record whose normal playback speed is 33.3 rev/min may be played back at a higher speed such as 45 rev/min. In this case the speed relationship is also inputted through the manipulating portion OP.

The central processing unit CPU receives such information or data indicative of the relationship between the actual playback speed and the normal or original recording speed. This information will be used to increase the sampling frequency fs in the same manner as in some of previous embodiments. As described in connection with such previous embodiments, the change in the sampling frequency fs results in the change in the reference pitch within the display device. Therefore, audio signals played back at a high speed can be accurately processed to determine each pitch of each sound.

In the embodiment of FIG. 18, although the speed relationship is manually inputted via the manipulating portion OP, such a speed relationship may be selected from a plurality of predetermined relationships provided in advance. Furthermore, if an objective audio signal to be played back at a high speed is recorded in a recording medium together with a clock or synchronous signal, such a clock or synchronous signal may be used to directly control the sampling frequency fs.

Figure 19:
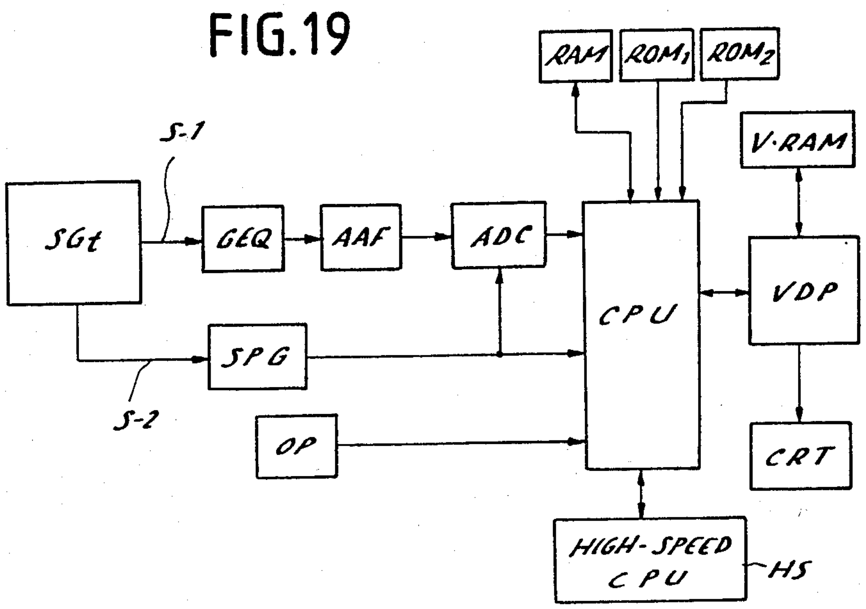

Hence, reference is now made to FIG. 19 showing another embodiment in which the sampling frequency is automatically controlled to shift the reference pitch within the display device so that an audio signal played back at a high speed is accurately processed. In FIG. 19, S-1 indicates an audio signal reproduced from a record/playback device SGt which is capable of reproducing a clock or synchronous signal S-2 simultaneously when playing back the audio signal. The reproduced synchronous signal S-2 is fed to a waveform shaping and amplifying circuit SPG which functions as a sampling pulse generator. Namely, an output signal from the waveform shaping and amplifying circuit SPG produces a sampling pulse signal which is fed to the AD converter ADC and to the central processing unit CPU.

Assuming that an audio signal is reproduced from one or more tracks of a magnetic recording tape, while a synchronous signal is reproduced from another track of the same magnetic recording tape which is driven at a speed higher than a normal playback speed, the frequency of the audio signal and the frequency of the synchronous signal both derived from the tape are higher than those at normal speed. Namely, the sampling frequency fs of the sampling pulse signal given to the AD converter ADC is higher than that at the normal speed such that the frequency increase rate is equal to the frequency increase rate for the audio signal. Since such a frequency-increased sampling pulse is used on AD conversion, the reference pitch within the display device is changed to accurately detect the original pitch of the sounds of the audio signal.

When reproducing an audio signal by use of such a record/reproduce device, since the playback speed is higher than the normal playback speed, it is necessary to process AD converted data for FFT operation at a high speed. To this end the circuit arrangments of FIGS. 18 and 19 comprise a high-speed central processing unit HS in addition to the central processing unit CPU. As such a high-speed central processing unit there may be used a 32-bit central processing unit, while the central processing unit CPU may be of 8 or 16-bit, and FFT operation is executed by the high-speed central processing unit HS. Furthermore, power spectrum calculation may also be executed by the high-speed central processing unit HS.

Figure 20A:
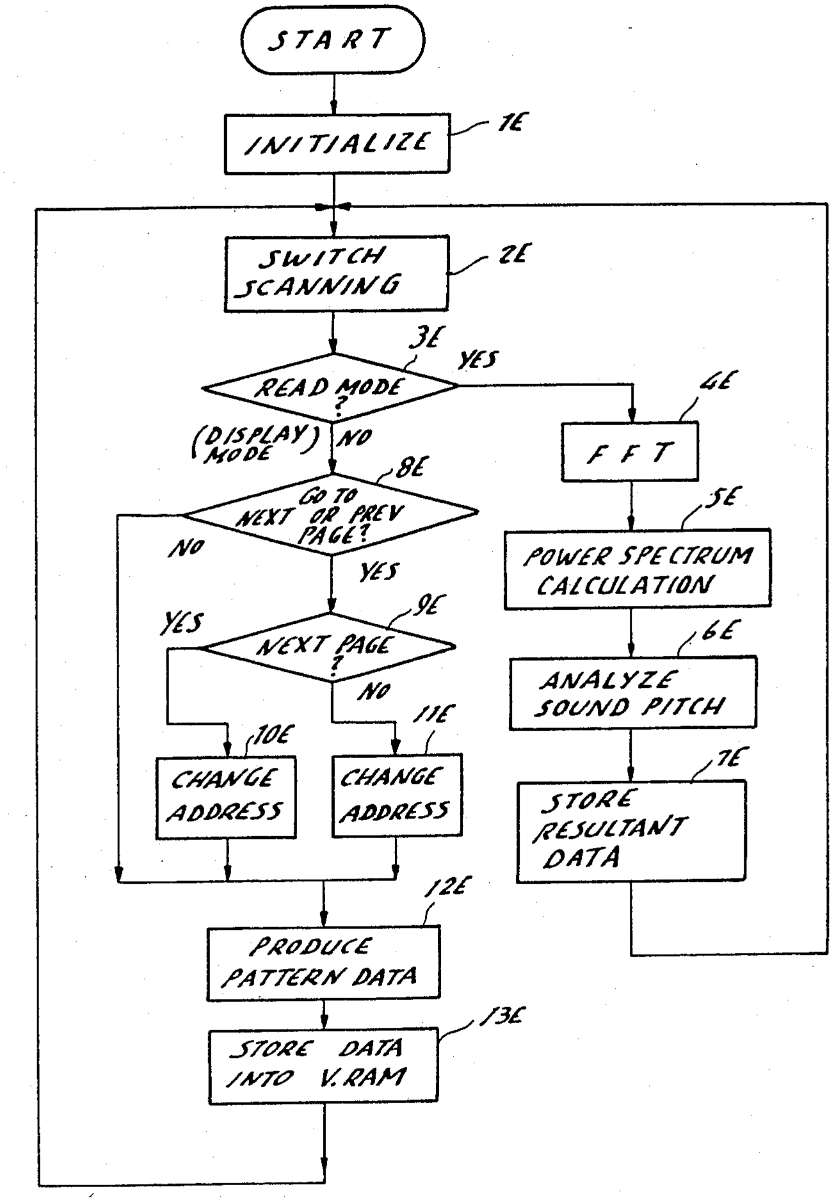
FIGS. 20A and 20B are flow charts showing the operation of the central processing unit used in the embodiment of FIGS. 18 and 19.
Figure 20B:
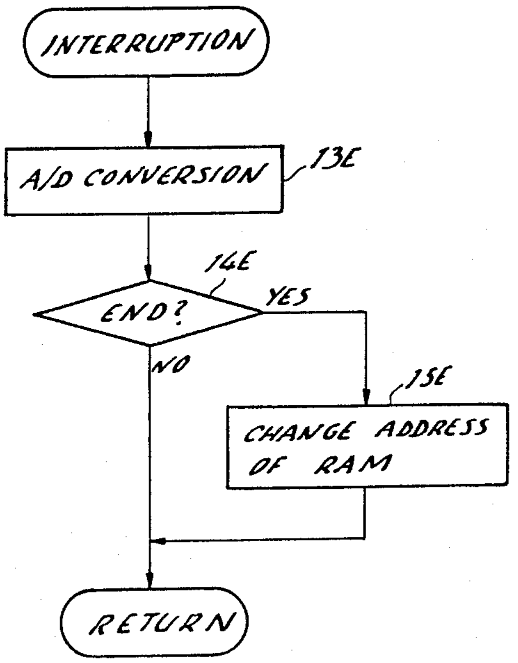

FIGS. 20A and 20B show flow charts used for the operation of the central processing unit CPU of either FIG. 18 or 19. FIG. 20A shows a main routine, while FIG. 20B shows an interrupt service routine. Although it is possible to use the the same interrupt service routine as that shown in FIG. 6B, the interrupt service routine shown in FIG. 20B is advantageous for high-speed operation as will be described hereinafter.

When the interrupt service routine of FIG. 20B is used, interruption occurs at an interval determined by the preset value of the internal counter in the same manner as in the previous embodiments. STEPs 13E and 14E respectively correspond to STEPs 8A and 9A of FIG. 6. Thus, when a predetermined number of digital data is obtained as the result of AD conversion by the AD converter ADC, all the addresses within the main memory RAM asigned for AD converted data are filled. Therefore, when all the addresses are filled, an address for storing subsequent digital data is changed from the last address to the first address within the predetermined addresses. As a result the subsequent digital data is stored at the first address where the oldest digital data has been stored. Namely, the oldest digital data is substituted with the newest digital data. In this way, following digital data are written in sequence such that the newest data is written at an address where the oldest data has been stored. Thus, AD converted digital data are continuously written without time interval. To this end the internal counter is cyclically reset to zero to start counting the number of digital data as soon as the count equals zero. In other words, the internal counter is not stopped as in the interrupt service routine of FIG. 6B.

The above-described manner of writing AD converted digital data into the main memory RAM is advantageous since data stored in the main memory RAM is always renewed to provide the newest data for FFT operation. As described above, when a high-speed central processing unit HS is employed for FFT operation, it takes a relatively short period of time to effect FFT operation. If the interrupt service routine of FIG. 6B is used, it is necessary to wait until a next set or group of digital data is prepared since all the digital data prestored in the main memory RAM is cleared each time the predetermined number of the digital data is reached. On the other hand, when the interrupt service routine of FIG. 20B is used, since the digital data stored in the main memory RAM is continuously renewed one by one, such that the predetermined number of digital data is always present, there is no need to wait to execute the next FFT operation. Therefore, each FFT operation can be effected by using the newest AD converted data, while the frequency of FFT operation can be increased to the operating speed of the high-speed central processing unit HS.

The manipulating portion OP comprises a READ/-DISPLAY switch, a PREV-PAGE button, and a NEXT-PAGE button. The READ/DISPLAY switch is used to select one of audio signal taking or reading mode and usual display mode. When it is intended to read and take an audio signal played back at a high speed to produce pitch name data therefor, the READ/DISPLAY switch is switched to read mode. After reading when it is intended to indicate musical notes on the screen of the display unit CRT by using already read and stored data, the READ/DISPLAY switch is switched to select the display mode. The PREV-PAGE and NEXT-PAGE buttons are used to select a previous page of a displayed music sheet or a next page of the same. Namely, when a piece of music is read by the display unit, since it is necessary to show musical notes by way of a plurality of music sheets, each sheet displayed at a single screen is given a page number starting from 1 for easy recognition of each music sheet. As described before, in the example of FIG. 4, 26 notes are displayed simultaneously, and such a picture including 26 notes is treated as one page.

Turning to the main routine of FIG. 20A, it is detected whether the display device is in audio signal taking or reading mode or in usual display mode by checking the state of the READ/DISPLAY switch. The read mode is selected to read an audio signal played back from the above-mentioned record/reproduce device SGd or SGt so as to determine the pitch of each sound and produce necessary data to store the same into the main memory RAM. In detail, in STEP 2E, switch scanning is effected to see the state of the READ/DISPLAY switch, and the state is determined in STEP 3E. When the read mode is selected, the determination in STEP 3E becomes YES to execute STEPs 4E through 6E which are similar to STEPs 2A through 5A of FIG. 6B. In STEP 4E, the central processing unit CPU produces an instruction so that the high-speed central processing unit HS executes FFT operation. In STEP 7E, data indicative of pitch name is stored in the main memory RAM. In this way reading of the input audio signal is effected to produce pitch name data which are stored in the main memory RAM in sequence.

When the objective audio signal is completely played back and corresponding pitch name data is prepared, the READ/DISPLAY switch may be switched to select the display mode. As the result, STEPs 8E through 13E are executed to indicate musical notes on the screen of the display unit CRT. In STEP 8E, it is determined whether either of the PREV-PAGE button or NEXT-PAGE button has been depressed. If the determination in STEP 8E is NO, STEPs 8E through 11E are skipped to execute STEPs 12E and 13E which are substantially the same as STEPs 6A and 7A of FIG. 6B. When the READ/DISPLAY switch is switched to select the display mode, the address designating the location of data within the main memory RAM for reading out the same therefrom is initialized so that pitch name data representing the first 26 notes will be read out. Therefore, the first page showing the beginning of the audio signal is indicated on the screen of the display unit CRT. When the user wishes to see a second page, he or she depresses the NEXT-PAGE button. This is detected in STEP 9E, and STEP 10E is executed to change the designating address. As a result, pitch name data corresponding to a second group of 26 notes is read out to produce a corresponding pattern data in the STEP 12. In this way, pages of music sheets to be displayed are turned one by one. When it is intended to see a previous page, the PREV-PAGE button is depressed, and then the determination in STEP 9E becomes NO to execute STEP 12E in which the designating address is changed to pick up pitch name data of the previous page.

Although in the flow chart of FIG. 20A, pages are changed one by one to either the next or previous page, it is possible to skip a number of pages so that the page number can be drasticaly changed immediately if a GO-TO-PAGE button and numerical data input keys are provided and steps for page-skipping is provided.

The above-described embodiments are just examples of the present invention, and therefore, it will be apparent for those skilled in the art that many modifications and variations may be made without departing from the spirit of the present invention.

What is claimed is:

1. A musical note display device for displaying musical notes, each note being indicative of a pitch of an input audio signal on a displayed staff, comprising:

(a) analog-to-digital converting means for converting said input audio signal into digital data by using sampling pulses having a sampling frequency;

(b) computing means for effecting FFT operation by using said digital data, for executing power spectrum calculation by using the result of FET operation, for determining a pitch of each sound by using spectrum data obtained by said power spectrum calculation, and determining a pattern to be displayed in accordance with each pitch;

said computing means determining the pitch by obtaining a fundamental tone by obtaining a frequency component whose level is lowest within a predetermined level range from a highest level, and whose frequency is lower than a frequency at which the level is the highest, and determining the pitch, in the case such a frequency component is not detected, by regarding the frequency component, whose level is the highest, as the fundamental tone; and (c) display means including a video display processor, a video RAM and a display unit, said video display processor being controlled by said computing means to store data indicative of said pattern into said video RAM, and said display unit being responsive to a video signal from said video display processor for indicating musical notes displayed at appropriate position on a displayed staff.

2. A musical note display device as claimed in claim 1, wherein said computing means is arranged such that;

it is determined whether or not the frequency component having the highest level is below a predetermined low frequency;

a frequency value of a frequency component having a lowest level within a second predetermined level range, which is wider than said first-mentioned predetermined level range, from the highest level and having a frequency which is below the frequency at which the level is the highest is determined as the pitch when the frequency component having the highest level is below the predetermined low frequency;

a frequency value of a frequency component whose level is lowest within said first-mentioned predetermined level range from the highest level, and whose frequency is lower than the frequency at which the level is the highest is determined as the pitch when the frequency component having the highest level is equal to or higher than the predetermined low frequency; and a frequency value of the frequency component having the highest level is determined as the pitch in the case such a frequency component is not detected.

3. A musical note display device as claimed in claim 1, wherein said computing means is arranged to determine whether the frequency component detected within said predetermined level range has an octave relationship with the frequency at which the level is the highest so that the frequency value of said frequency component detected within said predetermined level range is detected as the pitch only when said frequency value has an octave relationship with said frequency at which the level is the highest, and the frequency value of the frequency component having the highest level is determined as the pitch in the case said frequency value does not have an octave relationship with said frequency at which the level is the highest.

4. A musical note display device as claimed in claim 1, further comprising a low pass filter for limiting the frequency range of said input audio signal so that frequency limited signal is fed to said analog-to-digital converting means.

5. A musical note display device as claimed in claim 4, further comprising means for causing said computing means to stop the determination of pattern when the amplitude of signal components which have been removed by said low-pass filter is greater than the amplitude of signal components which have been passed through said low-pass filter.

6. A musical note display device as claimed in claim 5, wherein said means for causing said computing means comprises an inverter responsive to an output signal from said low pass filter; an adder for adding said input audio signal to an output signal from said inverter; a first rectifier-smoothing circuit responsive to the output signal from said low-pass filter; a second rectifier-smoothing circuit responsive to an output signal from said adder; and a comparator responsive to output signals from said first and second rectifier smoothing circuits.

7. A musical note display device as claimed in claim 1, further comprising:

(a) an adder for producing a sum signal by adding a first signal component of said input audio signal to a second signal component of said input audio signal;

(b) a subtractor for producing a difference signal by subtracting said second signal component from said first signal component; and (c) a selection circuit responsive to said first and second signal components, sum signal and difference signal for outputting one of its input signals to said analog-to-digital converting means.

8. A musical note display device as claimed in claim 1, further comprising:

(a) an absolute value detecting circuit responsive to said input audio signal for supplying said analog-to-digital converting means with its output signal; and (b) a sign detector responsive to said input audio signal for supplying said computing means with its output signal so that the output signal from said sign detector is stored in a memory together with digital signals from said analog-to-digital converting means.

9. A musical note display device as claimed in claim 1, wherein said computing means is arranged to execute an interrupt service routine for the control of said analog-to-digital converting means.

10. A musical note display device as claimed in claim 9, wherein said central processing unit comprises an internal counter in which a sampling period for the analog-to-digital converting means is set to determine said sampling frequency of said sampling pulses, said central processing unit being arranged to execute said interrupt service routine at an interval of said sampling period.

11. A musical note display device as claimed in claim 1, further comprising a graphic equalizer responsive to said input audio signal for changing frequency response prior to AD conversion.

12. A musical note display device as claimed in claim 11, wherein said graphic equalizer comprises a switch for connecting its input terminal to its output terminal for nullifying the frequency response of said graphic equalizer.

13. A musical note display device as claimed in claim 1, wherein said computing means is arranged to be put in a HOLD mode in which operation for indicating a subsequent musical note is prohibitted.

14. A musical note display device as claimed in claim 1, wherein said computing means is arranged to be put in a HALT mode in which operation for erasing an already displayed musical note or adding a new musical note is effected.

15. A musical note display device as claimed in claim 1, wherein said computing means is arranged to determine whether the displayed staff is filled with a predetermined number of musical notes or not, and to clear all the displayed musical notes when the staff if filled with the predetermined number of musical notes.

16. A musical note display device as claimed in claim 1, wherein said computing means is arranged to determine whether the displayed staff is filled with a predetermined number of musical notes or not, and to shift data within said video RAM when the staff is filled with the predetermined number of musical notes so that musical notes are shifted horizontally.

17. A musical note display device as claimed in claim 1, wherein said computing means is arranged to determine whether the displayed staff is filled with a predetermined number of musical notes or not, and to shift data within said video RAM when the staff is filled with the predetermined number of musical notes so that musical notes are shifted vertically from one staff to another staff.

18. A musical note display device as claimed in claim 1, wherein said computing means is arranged to await a given time length each time a new musical note is displayed.

19. A musical note display device as claimed in claim 16, further comprising means for manually changing said time length for selecting a desired tempo.

20. A musical note display device as claimed in claim 1, further comprising control means responsive to said computing means for controlling an external recording device so that data from said video display processor is intermittently recorded by said external recording device.

21. A musical note display device as claimed in claim 20, wherein said computing means is arranged to cause said control means to control said external recording device such that a video signal indicative of a picture including a predetermined number of musical notes is recorded.

22. A musical note display device as claimed in claim 1, further comprising an oscillator arranged to oscillate at a variable audio frequency, switching means for selectively applying said input audio signal and an audio frequency signal from said oscillator to said analog-to-digital converting means.

23. A musical note display device as claimed in claim 22, further comprising means for emitting sound in response to said audio frequency signal from said oscillator.

24. A musical note display device as claimed in claim 22, wherein said computing means is arranged to analyze the sound pitch of said audio frequency signal from said osillator for controlling the sampling frequency of the sampling pulses applied to said analog-to-digital converting means.

25. A musical note display device as claimed in claim 22, wherein said computing means is arranged to analyze the sound pitch of said input audio signal inputted as a reference pitch signal for controlling the sampling frequency of the sampling pulses applied to said analog-to-digital converting means.

26. A musical note display device as claimed in claim 1, further comprising an oscillator arranged to oscillate at a variable frequency, a frequency divider for dividing the frequency of an output signal from said oscillator by a plurality of values so that a plurality of audio frequency output signals are obtained such that the relationship between these audio frequency output signals is either one or more octaves, and means for emitting sound in response to said audio frequency signals from said frequency divider.

27. A musical note display device as claimed in claim 26, wherein said computing means is arranged to determine the frequency of said audio frequency signal from said osillator for controlling the sampling frequency of the sampling pulses applied to said analog-to-digital converting means.

28. A musical note display device as claimed in claim 1, wherein said computing means comprises a first central processing unit for effecting said FFT operation and a second central processing unit for executing said power spectrum calculation, the determination of the pitch of each sound, and the determination of pattern to be displayed, said first central processing unit being capable of operating at a speed higher than that of said second central processing unit.

29. A musical note display device as claimed in claim 28, further comprising means for manually controlling said sampling frequency of said sampling pulses fed to said analog-to-digital converting means.

30. A musical note display device as claimed in claim 28, further comprising means responsive to a synchronous signal given to said display device together with an input audio signal which is played back from an audio signal playback device, for producing said sampling pulses fed to said analog-to-digital converting means such that the frequency of said sampling pulses changes in proportion to the frequency of said synchronous signal.

31. A musical note display device as claimed in claim 28, wherein said display device is arranged to put in either READ mode in which said audio signal from said playback device is analyzed to determine the pitch of each sound thereof, or DISPLAY mode in which musical notes are displayed by using data indicative of pitch determined in said READ mode.

32. A musical note display device as claimed in claim 31, wherein said second central processing unit is arranged to change a designating address of a memory in which data determined in said READ mode is stored, in response to a manually inputted instruction.

33. A musical note display device as claimed in claim 1, further comprising a means for automatically controlling the level of said input audio signal so that the level does not exceed a predetermined level which can be handled by said analog-to-digital converting means.

34. A method for detecting a pitch of sound of an input audio signal, comprising the steps of:

(a) converting said input audio signal into digital data;
(b) effecting FFT operation by using said digital data;
(c) executing power spectrum calculation by using the result of FFT operation;
(d) obtaining a fundamental tone to determine the pitch of said sound of said input audio signal by using spectrum data obtained by said power spectrum calculation, the step of obtaining said fundamental tone having the steps of:
obtaining a frequency value of a frequency component whose level is lowest within a predetermined level range from a highest level and whose frequency is lower than a frequency at which the level is highest; and
obtaining a frequency value at which the level is highest in the case no frequency component is detected within said predetermined level range in the above step.

35. A method of detecting a pitch of sound of an input audio signal, comprising the steps of:

(a) converting said input audio signal into digital data;
(b) effecting FFT operation by using said digital data;
(c) executing power spectrum calculation by using results of said FFT operation;
(d) obtaining a fundamental tone to determine the pitch of said sound of said input audio signal by using spectrum data obtained by said power spectrum calculation, the step of obtaining said fundamental tone having the steps of:
detecting whether the frequency component at which the level is the highest is below a predetermined low frequency or not;
obtaining a frequency value of a frequency component whose level is lowest within a first predetermined level range from a highest level and whose frequency is lower than a frequency at which the level is highest when the frequency component at which the level is the highest is equal to or higher than said predetermined low frequency;
obtaining a frequency value of a frequency component whose level is lowest within a second predetermined level range which is wider than said first predetermined level range, from a highest level and whose frequency is lower than a frequency at which the level is highest when the frequency component at which the level is the highest is below said predetermined low frequency; and
obtaining a frequency value at which the level is highest in the case no frequency component is detected within said first and second predetermined level range in the above steps.

* * * * *